(12) United States Patent
Dutta

(10) Patent No.: US 7,298,234 B2
(45) Date of Patent: Nov. 20, 2007

(54) HIGH SPEED ELECTRICAL INTERCONNECTS AND METHOD OF MANUFACTURING

(75) Inventor: Achyut Kumar Dutta, Sunnyvale, CA (US)

(73) Assignee: Banpil Photonics, Inc., Santa Clara, CA (US)

( * ) Notice: Subject to any disclaimer, the term of this patent is extended or adjusted under 35 U.S.C. 154(b) by 17 days.

(21) Appl. No.: 10/904,731

(22) Filed: Nov. 24, 2004

(65) Prior Publication Data

US 2005/0237137 A1    Oct. 27, 2005

Related U.S. Application Data

(60) Provisional application No. 60/481,703, filed on Nov. 25, 2003.

(51) Int. Cl.
    *H01P 3/08*      (2006.01)

(52) U.S. Cl. .................. 333/246; 333/236; 333/245

(58) Field of Classification Search ............... None
See application file for complete search history.

(56) References Cited

U.S. PATENT DOCUMENTS

| | | | | |
|---|---|---|---|---|
| 2,800,634 | A * | 7/1957 | Engelmann et al. | 333/238 |
| 5,105,055 | A * | 4/1992 | Mooney et al. | 174/27 |
| 5,471,181 | A * | 11/1995 | Park | 333/246 |
| 5,796,321 | A * | 8/1998 | Caillat et al. | 333/246 |
| 5,990,768 | A * | 11/1999 | Takahashi et al. | 333/247 |
| 6,414,573 | B1 * | 7/2002 | Swineford et al. | 333/238 |
| 6,518,864 | B1 * | 2/2003 | Ito et al. | 333/238 |
| 6,603,376 | B1 * | 8/2003 | Handforth et al. | 333/238 |
| 6,621,384 | B1 * | 9/2003 | Handforth et al. | 333/238 |
| 6,674,347 | B1 * | 1/2004 | Maruhashi et al. | 333/238 |
| 6,888,427 | B2 * | 5/2005 | Sinsheimer et al. | 333/238 |

* cited by examiner

*Primary Examiner*—Robert Pascal
*Assistant Examiner*—Kimberly E Glenn

(57) ABSTRACT

High-speed interconnect systems for connecting two or more electrical elements are provided. Interconnect system has the means, which could reduce the microwave loss induced due to the dielectrics. Reducing the effective loss tangent of the dielectrics reduces the microwave loss. With optimize design of the interconnects, the speed of the electrical signal can be made to closer to the speed of the light. The interconnect systems consists of the electrical signal line, inhomogeneous dielectric systems and the ground line, wherein inhomogeneous dielectric system consisting of the opened-trenches into the dielectric substrate or comb-shaped dielectrics to reduce the microwave loss. Alternatively dielectric structure can have the structure based on the fully electronic or electromagnetic crystal or quasi crystal with the line defect. Alternatively, dielectric structure can be made to comb-shaped structure with teethes having thickness and space making the air pocket to reduce the microwave loss. The interconnect system, can be made in rigid or flex board for off-chip interconnects for IC packages, connectors and cables, where conventional manufacturing technology can be used and yet to increase the bandwidth of the interconnects.

31 Claims, 26 Drawing Sheets

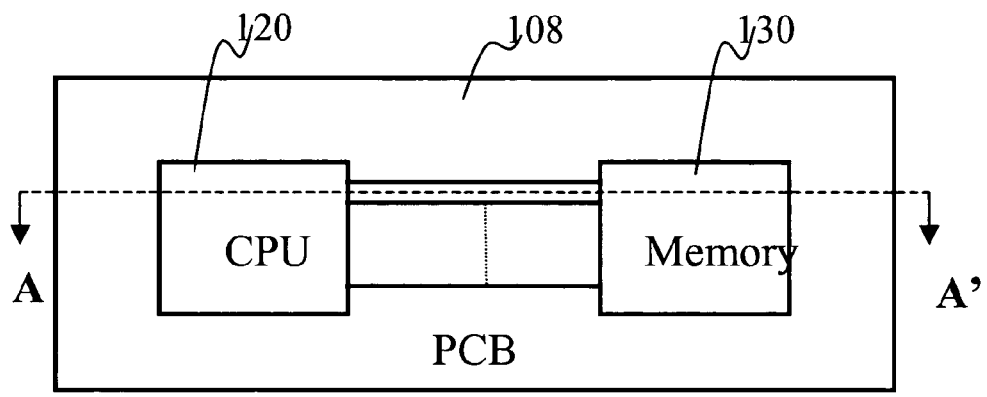
FIG. 1A
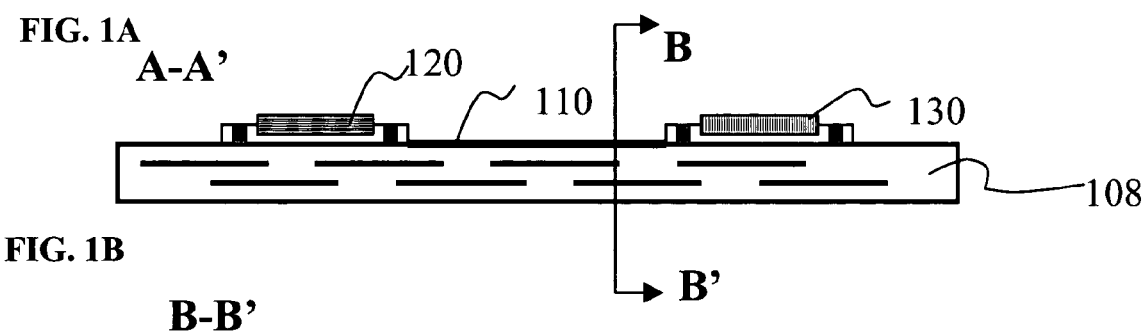
FIG. 1B
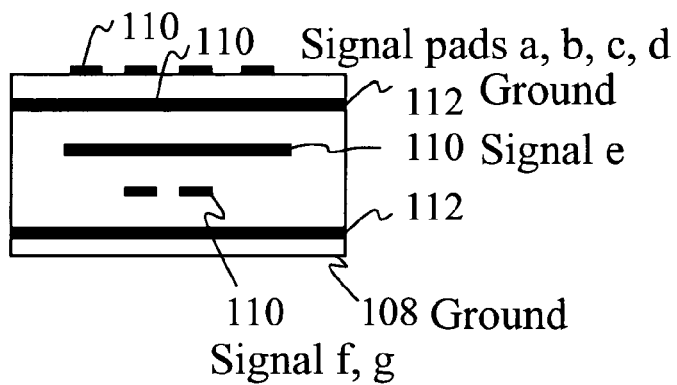
FIG. 1C
FIG. 1

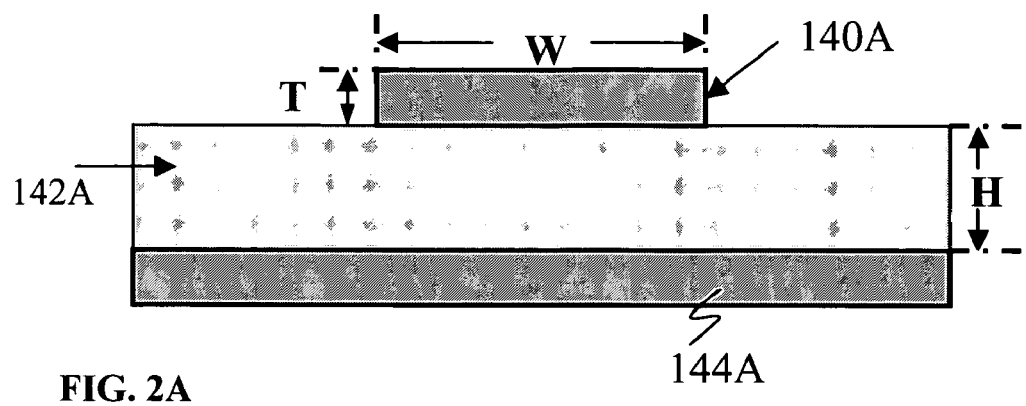
FIG. 2A
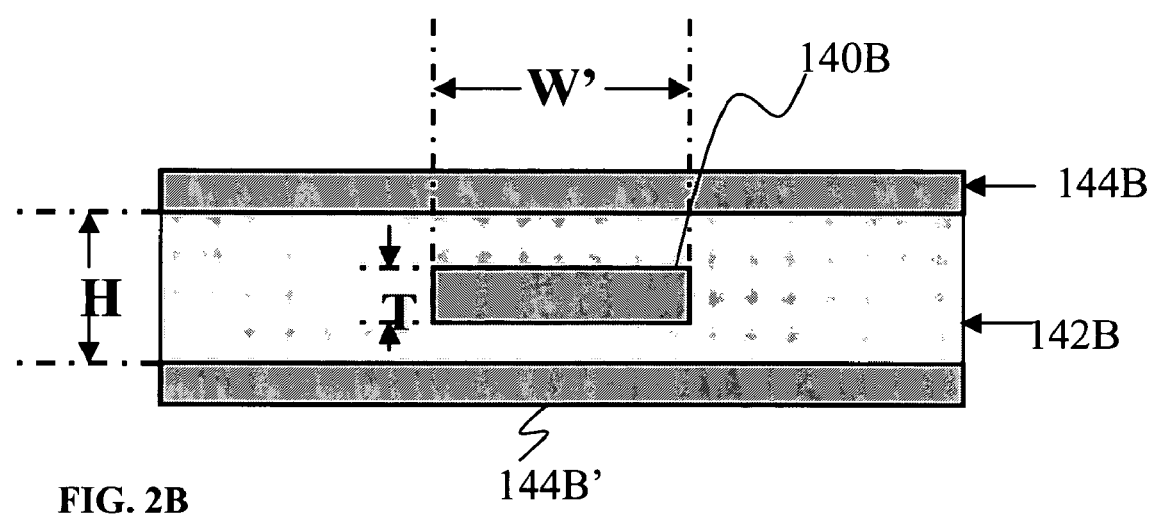
FIG. 2B
FIG. 2

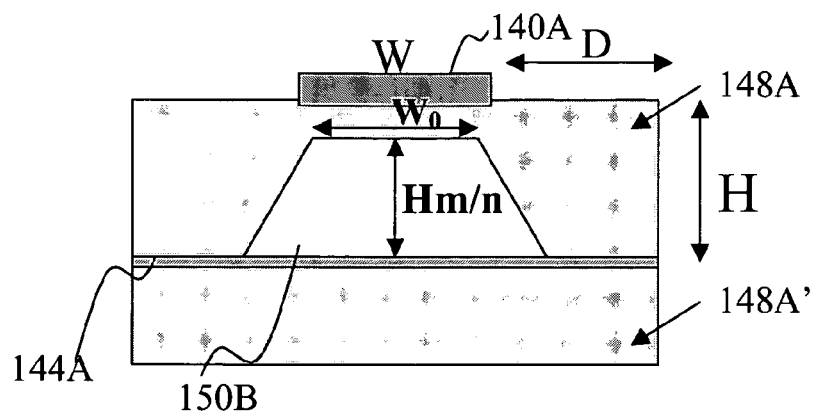
FIG. 4A
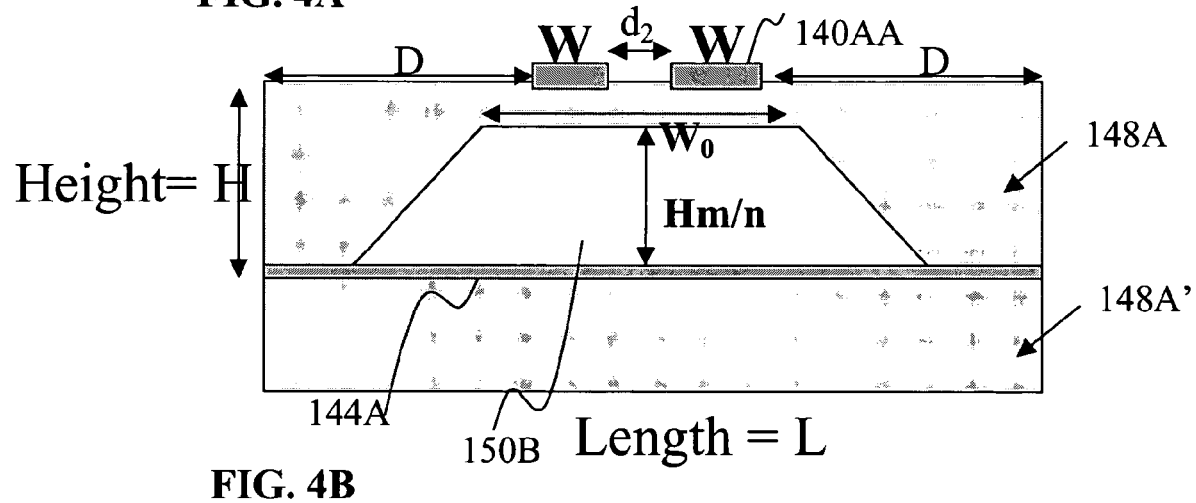
FIG. 4B
FIG. 4

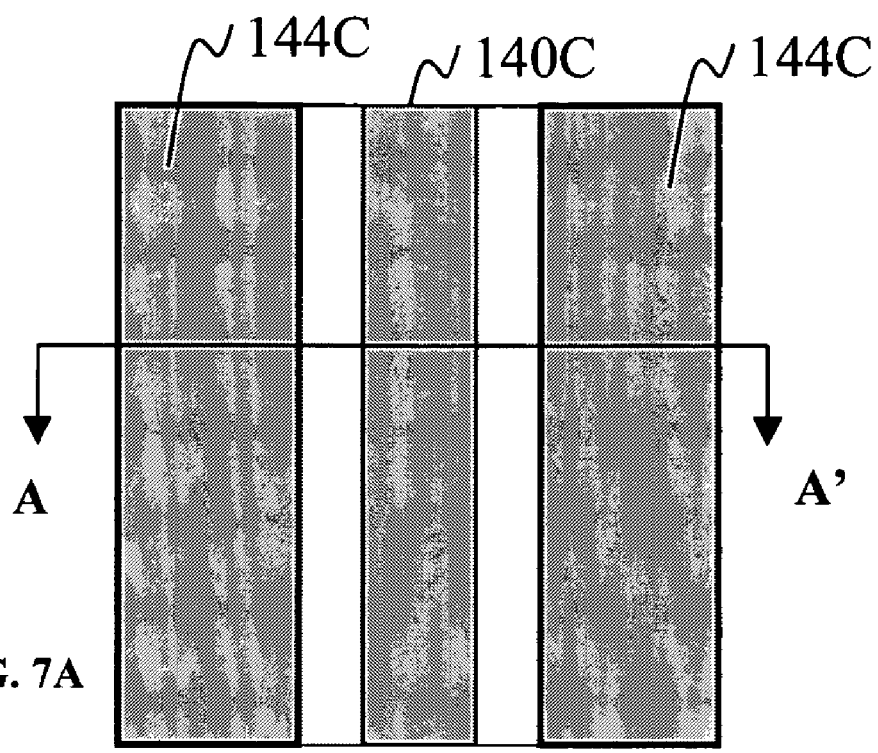
FIG. 7A
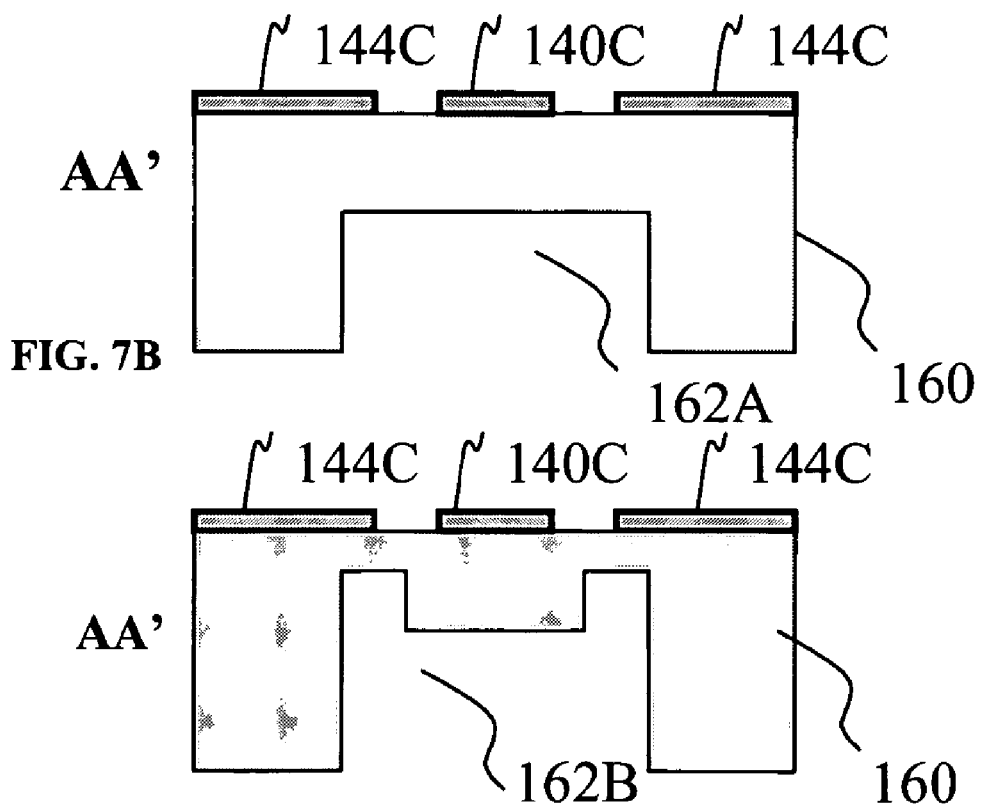
FIG. 7B
FIG. 7C
FIG. 7

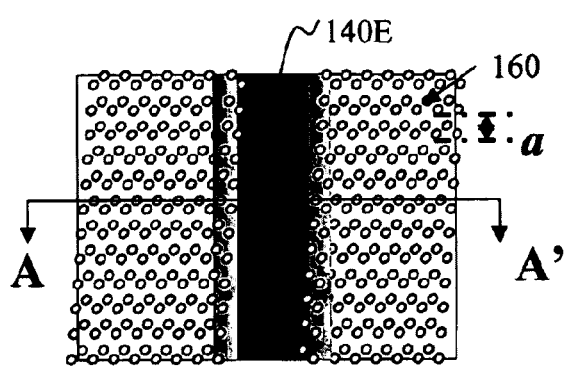
FIG. 8A
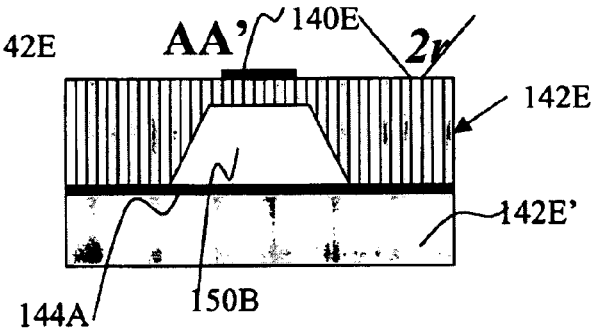
FIG. 8B
FIG. 8C
FIG. 8

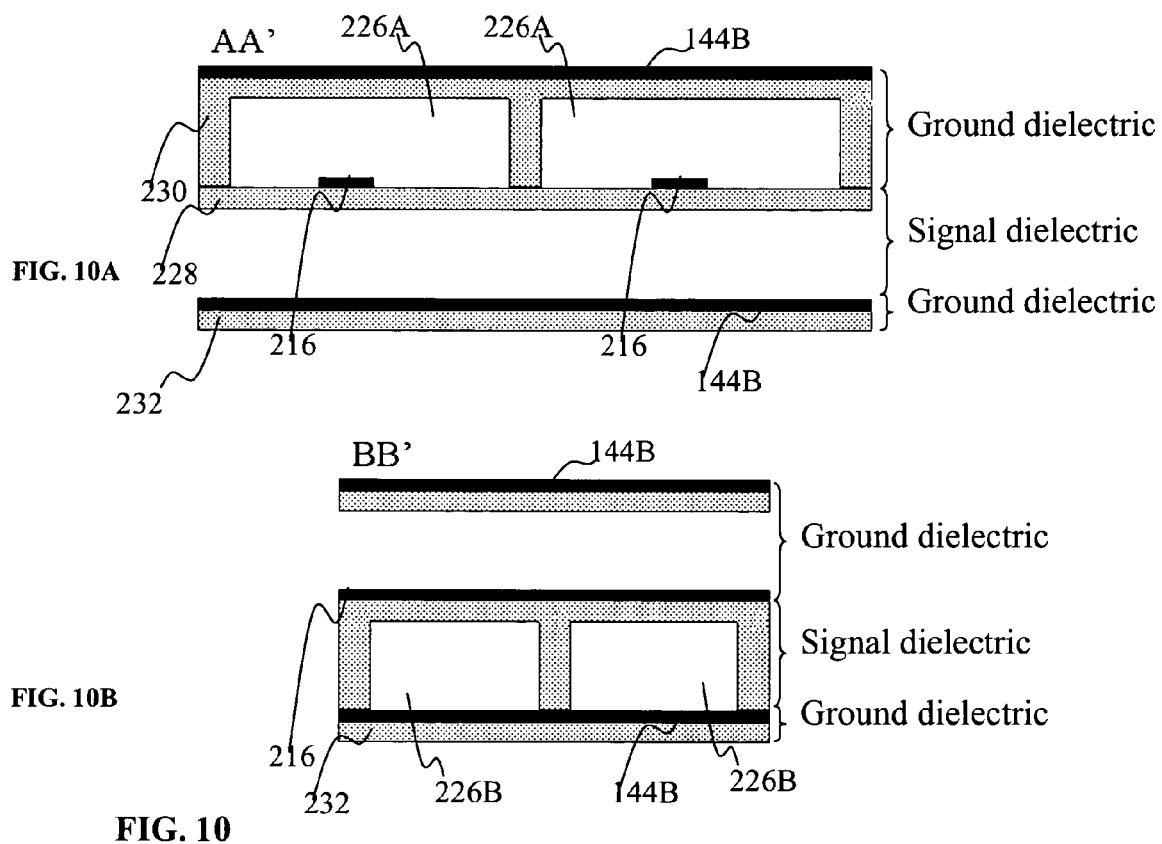

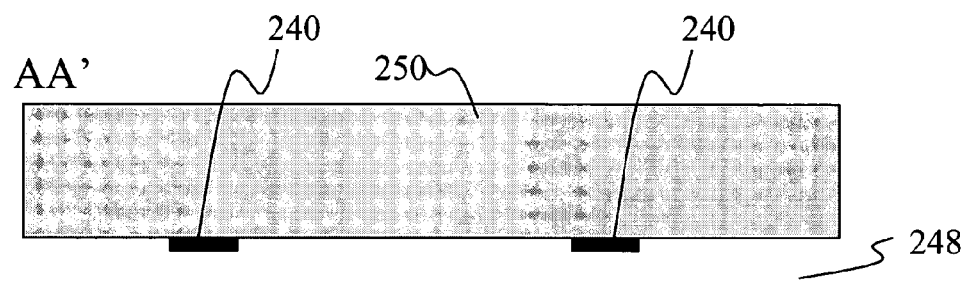
FIG. 13B
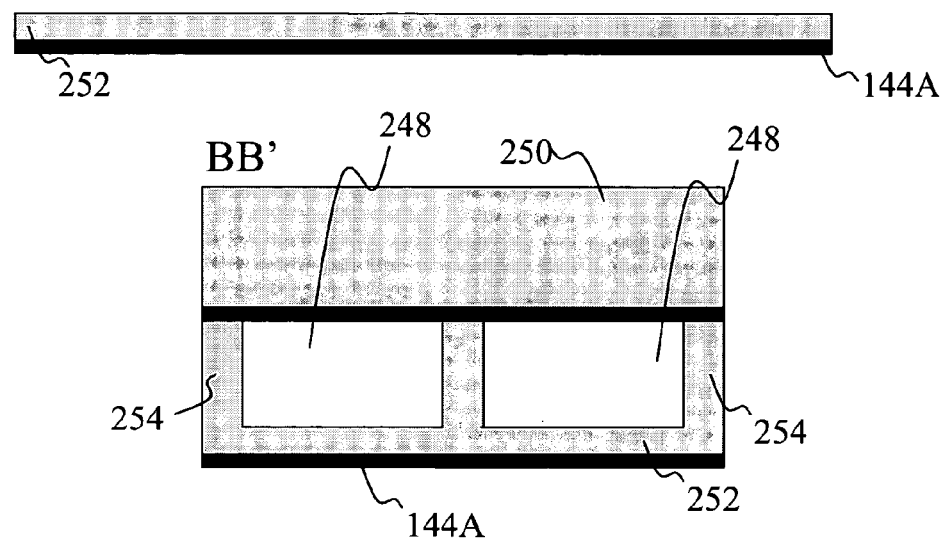
FIG. 13C
FIG. 13

FIG. 14A (MSL and SL)

FIG. 14B (CPW and SL)

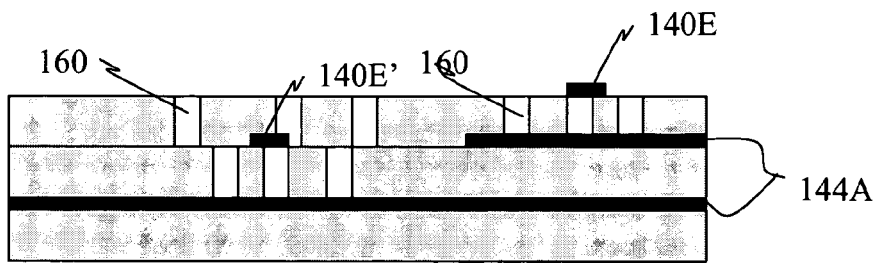
FIG. 15A
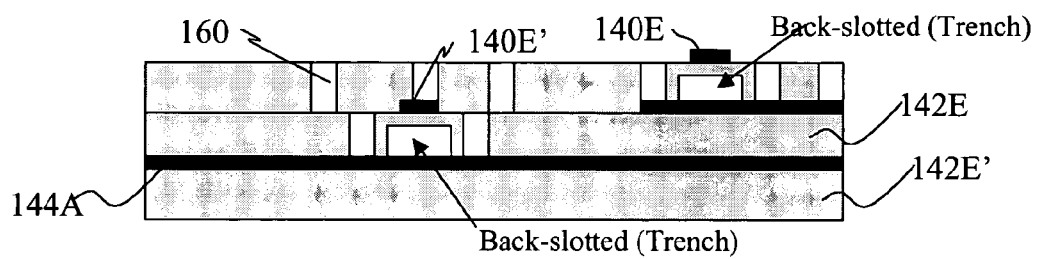
FIG. 15B
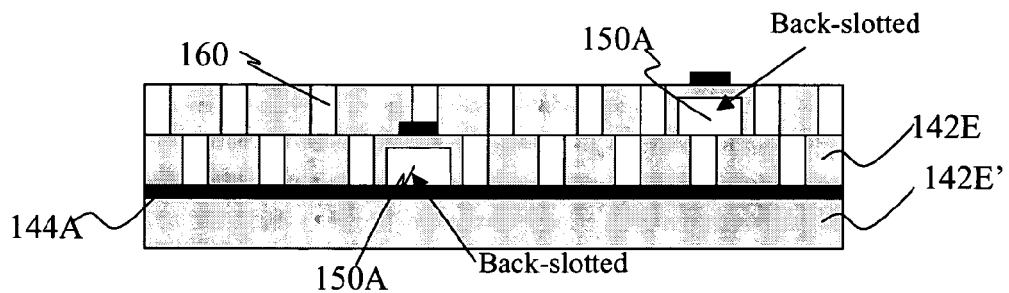
FIG. 15C
FIG. 15

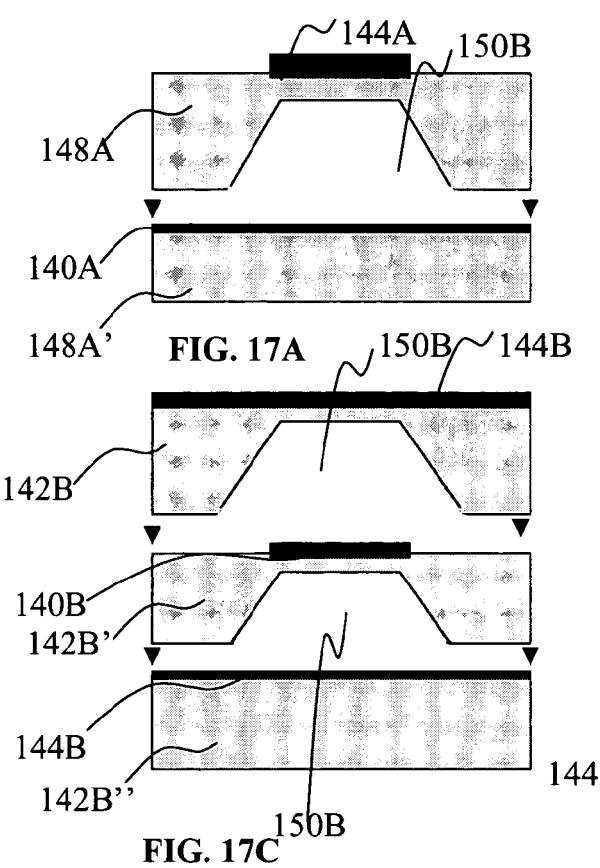
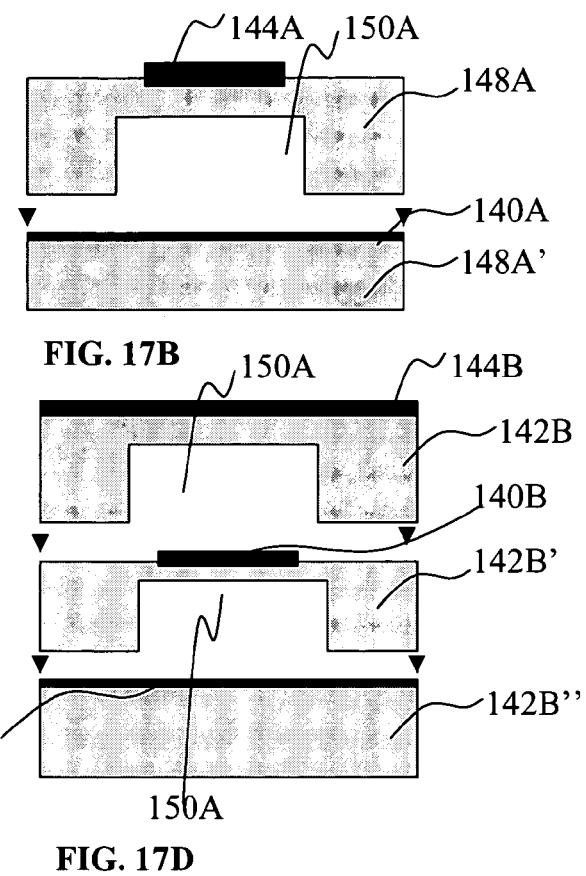
FIG. 17A FIG. 17B FIG. 17C FIG. 17D

HIGH SPEED ELECTRICAL INTERCONNECTS AND METHOD OF MANUFACTURING

CROSS REFERENCE TO RELATED APPLICATIONS

This application claims the benefit of U.S. Provisional Patent Application No. 60/481,703 filed on Nov. 25, 2003.

FIELD OF THE INVENTION

This invention relates to the interconnection of electronics elements in on-chip (inside the chip) and off-chip (board level) level interconnection, high-speed connector, cable fabrication. More particularly, this invention is related to, (a) connecting two or more electronic devices inside the chip, (b) connecting the high speed signal lines two or more chips (e.g. processors), useful in high speed systems including personnel computer (PC) super-computer, game system, imaging system, communication system, and (c) also interface means (as the connector or cable) to connect two or multiple high speed electronics elements.

BACKGROUND OF THE INVENTION

The increasing level of integration within electrical integrated circuits (IC) leads to both higher data rates and larger number of IC interconnections. Today, the inherent signal speed of ICs is increasing to 5 GHz, and shortly it will reach 20 GHz and beyond. The number of pin connection is also increasing, with single ICs requiring close to 2000 interconnections (i.e. single processor), and shortly it will increase to over 5000. Simultaneously achieving higher data rates and higher interconnect densities for both on-chip and also off-chip, will be increasingly difficult as the IC technologies continue to evolve increasing signal speed of electronic devices and interconnection number. In on-chip cases (inside the die), as the number of the electronic devices such as transistors are increased with continued development of fabrication technology, interconnecting electronic devices without sacrificing signal speed is becoming an increasing challenge. In the off-chip case, high density interconnects, covering from die-level packaging to chip-to-chip (hereafter chip indicates the die with package) interconnection on the printed circuit board (PCB), will also become increasingly difficult as the IC technologies continue to evolve, thereby increasing the signal speed and interconnection number.

With increased signal speed and interconnection number within and outside of the IC, low-cost high-level interconnect techniques compatible with today's manufacturing technology is highly desirable.

Generally, it is known that if the electronic devices (for both on-chip and off-chip) are connected with the help of the metal conductor (act as the interconnects), electrical signal can be flown and the electronic device can be connected with each other. This is true for low-speed signal, below a few MHz. At multi GHz frequencies, interconnect lengths become a significant fraction of the wavelength of the high frequency harmonics, and therefore interconnects must be designed with proper concern of impedance, cross talk, and attenuation. Significant attenuation and rise-time degradation can be caused by losses in the transmission line. As is readily appreciated by those skilled in the art, the transmission line loss is the sum of the conductor loss and dielectric loss, both of which are dependent on the frequency. This dielectric loss is dependent on the loss tangent (tangent loss) of the materials and it varies from dielectric to dielectric. For example, the PCB materials like FR4 have the loss tangent of 0.018, whereas the alumina has the 0.0008. The less the tangent loss of the dielectric, the lower the transmission loss for the given interconnect distance and fixed conductor loss. Using the low-loss tangent material, would help to increase the signal carrying capacity of the interconnects.

FIG. 1 is the schematic showing part of conventional off-chip interconnection. In off-chip interconnection, such as that shown in FIG. 1, the chip 120 (for example processor or memory) is connected with chip 130 by multilayered electrical signal lines 110 and ground lines 112 contained within PCB 108. Conventional printed circuit board (PCB) materials are mainly FR4, Roger, and alumina. Low cost PCB material is mainly FR4, which is frequently used. The metal used for interconnects is mainly copper which is used for routing the signals.

Conventional interconnection technology for off-chip is mainly based on the microstrip line or strip-line transmission layout on the dielectric material. FIG. 2A shows a cross-sectional of a microstrip layout, which refers to a trace routed as the top or bottom layer for example of a PCB for the case of off-chip interconnection. The electrical conductor 140A with width W and thickness T are laid on the dielectric material 142A having height H. The ground or power line 144A is located opposite of the signal conductor 140A. FIG. 2B is the cross-sectional view of strip line layout, which uses a trace 140B routed on the inside layer 142B for example of a PCB and has two voltage-reference planes (i.e. power and/or ground) 144B and 144B'.

For high-speed signal interconnection, a lower loss tangent is necessary. Lower loss tangent material offers following functions for off-chip interconnects;

(a) higher density interconnection due to reduction of the cross-talk, (b) reducing the capacitance of the interconnection, helping to transfer the signal longer distance, (c) lower propagation delay, and (d) reducing the microwave loss and help to transmit the longer distance. In other words, it helps to transmit the higher speed signal a longer distance.

Besides the dissipation-factor of the dielectric materials, the microwave loss also limits the bandwidth of the interconnection. Microwave-loss occurs due to the electrode structure mainly from skin-depth of the signal. As Cu's skin-depth at 100 GHz is 0.2 μm, the skin-depth due to the conductor structure is neglected. So, the bandwidth of the interconnection (for off-chip interconnection) is mainly dependent on the material loss tangent (dielectric loss).

It is relatively straight forward that increasing the bandwidth can be possible using of the material having lower loss tangent. However, in this case, new PCB material development is necessary. Besides, manufacturing process is also needed to develop compatible to new PCB materials.

Much work can be found in off-chip interconnection technology focusing on the material development for achieving the low-loss tangent material. The development cost of these low loss tangent materials is very high and implementing into the practical system would not only increase the system cost, but also reduce the reliability. Today, other areas of focusing area to overcome the high microwave loss (due to the dielectric) include the use conventional materials such as FR4 (board material), or shortening the length on the interconnection layout to reduce the transmission loss and signal integrity. In both cases, implementing such technology would require one to pay high cost.

As explained above, the conventional electronics interconnect technology being used in off-chip interconnection cannot be used, as the signal speed is increasing. Existing conventional electrical interconnects have the limitation of achieving the bandwidth in certain level, beyond that, either new low loss-tangent material development is necessary or new interconnect technology using conventional material is required. Developing low-loss tangent material and its related manufacturing process for PCB build-up require high investment and time. It is highly desirable to have the innovative interconnect technology, which would use conventional material and conventional manufacturing processes, but a lower effective loss tangent. This technique or technology can be easily implemented as they can use the standard dielectric material used in PCB industries.

SUMMARY OF THE INVENTION

Accordingly, it is an object of the invention to provide a technique to reduce the effective loss-tangent of the interconnection system material to increase the bandwidth. Reducing effective loss-tangent reduces the microwave loss due to the dielectric material.

According to the invention it is an object of this invention to provide the interconnection structure to reduce the microwave-loss by adopting the interconnection structure.

According to the invention it is an object of this invention to use the conventional dielectric materials frequently used in the off-chip interconnects.

Another object of this invention is to provide the manufacturing process of the interconnects for off-chip interconnections using the conventional PCB manufacturing technology.

Another object of this invention is to provide the structure for making the high bandwidth connector and cable. This helps to increase the bandwidth of the cable/connector tremendously using the existing material system.

It is also object of this invention to provide a structure for the interconnects which can increase the electrical signal propagation speed closer to the light.

According to the invention, the interconnects system comprises, (i) single or multiple electrical conductors for carrying the electrical signal from one electronics elements to another and vice-versa for electrical communication;

(ii) a dielectric system comprising (a) periodic arrays of dielectric spheres or cylinder with certain diameter and the pitch, located outside the electrical signal line (conductor), and designed to handle the signal frequency, and;

(iii) a ground or power line opposite side of the dielectric system;

wherein the shape of the periodic dielectric structure could be the square or hexagonal or the shape convenient in the manufacturing.

According to the invention, the interconnection system comprises, (i) single or multiple electrical signal lines for carrying the electrical signal from one electronics elements to another and vice-versa for electrical communication;

(ii) a first dielectric system comprising, along with the opened trenches located below the signal line and passing along the signal lines, wherein the shape of the trenches are quadrateral, or square or rectangular or circular, or the shape convenient to the manufacturing process, and the trenches are filled with air or vacuum or low loss-tangent material, and;

(iii) a ground or power line located opposite side of the first dielectric system, or the separate second dielectric system carrying the ground or power line attached with the first dielectric system.

According to the invention, the interconnects system comprises, (i) a ground or power (metal) line;

(ii) a first dielectric system having opened trenches, wherein the shape of the trenches are the quadrateral, or square or rectangular or circular, or the shape convenient in the manufacturing, and the trenches are filled with air or vacuum or low loss-tangent material;

(iii) single or multiple electrical (metal) signal lines for carrying the high speed electrical signal from one electronics elements to another and vice-versa for electrical communication;

(iv) a second dielectric systems comprises with the opened trenches located below the signal line and pass along the signal lines, wherein the shape of the trenches are the quadrateral, or square or rectangular or circular, or the shape convenient in the manufacturing and the trenches are filled with air or vacuum, and;

(v) a third dielectric system carrying the ground or power line in one side;

wherein the first, second, and third dielectric systems with the signal lines and power or ground lines are attached together to form the interconnects.

According to this invention, the trench under the signal lines can be opened in such as way that full or portion of the dielectric material can be removed, and opened trench's deepness and wideness are dependent on bandwidth requirement.

According to this invention, the trench can be opened in the same dielectric having the metal signal lines or trench can be made in the separate dielectrics having the ground line.

According to this invention, single trench can be opened for each signal line.

Alternatively, according to this invention, a wide trench can be made for single or more signal lines close proximity to each other.

According to the invention, the interconnects system comprises, (i) a ground or power line in one side of the uniform dielectric system;

(ii) a first comb-shaped dielectric system comprising (a) a series of the teethes with certain thickness and with a certain separation between the teeth, located one side of the second dielectric, (b) uniform dielectric layer left, and (c) the single or multiple signal lines located opposite side of the dielectric system, wherein the shape of space between each teeth is quadrateral, or square or rectangular or circular, or the shape convenient in the manufacturing, and the spaces are filled with air or vacuum or low dielectric constant and low loss tangent material, and;

(iii) a second comb-shaped dielectric system comprising (a) a series of the teethes with certain thickness and with a certain separation between the teeth, located one side of the dielectric, (b) uniform dielectric layer left, and (c) a ground or power plan, wherein the shape of space between each teeth is quadrateral, or square or rectangular or circular, or the shape convenient in the manufacturing, and the spaces are filled with air or vacuum or low dielectric constant and low loss tangent material;

wherein uniform dielectric system, first comb-shaped dielectric system, and second comb-shaped dielectric systems are stacked together to make the stripline type of configuration, and air-pocket created between the teethes along the direction of the signal lines helps to reduce the effective loss-tangent and increase the signal carrying capacity of the interconnects.

According to the invention, the interconnection system comprises, (i) a first comb-shaped dielectric system comprising (a) a series of teeth with certain thickness and with a certain separation between the teeth, located on one side of the dielectric, (b) uniform dielectric layer left, and (c) a ground or power plan located opposite side of the teeth, wherein the shape of space between each tooth is quadrateral, or square or rectangular or circular, or the shape convenient in the manufacturing, and the spaces are filled with air or vacuum or low dielectric constant and low loss tangent material;

(ii) a second comb-shaped dielectric system comprising (a) a series of teeth with certain thickness and with a certain separation between the teethe, located one side of the dielectric, (b) uniform dielectric layer left, and (c) the single or multiple signal lines located opposite side of the second comb-shaped dielectric system, wherein the shape of space between each teeth is quadrateral, or square or rectangular or circular, or the shape convenient in the manufacturing, and the spaces are filled with air or vacuum or low dielectric constant and low loss tangent material, and;

(iii) a uniform dielectric system carrying the ground or power plans;

wherein first comb-shaped dielectric system, second comb-shaped dielectric system, and uniform dielectric systems are stacked together to make a stripline type of configuration, and air-pocket created between the teeth along the direction of the signal lines helps to reduce the loss-tangent and increase the signal carrying capacity of the interconnects.

According to the invention, the interconnection system comprises, (i) a first comb-shaped dielectric system comprising (a) a series of the teeth with certain thickness and with a certain separation between the teeth, located on one side of the dielectric, (b) uniform dielectric layer left, and (c) a ground or power plan located opposite side of the teeth, wherein the shape of space between each tooth is quadrateral, or square or rectangular or circular, or the shape convenient in the manufacturing, and the spaces are filled with air or vacuum or low dielectric constant and low loss tangent material;

(ii) a uniform thin dielectric layer carrying the single or multiple signal lines, and;

(iii) a second comb-shaped dielectric system comprising (a) a series of the teeth with certain thickness and with a certain separation between the teeth, located on one side of the dielectric, (b) uniform dielectric layer left, and (c) a ground or power plan, wherein the shape of space between each tooth is quadrateral, or square or rectangular or circular, or the shape convenient in the manufacturing, and the spaces are filled with air or vacuum or low dielectric constant and low loss tangent material;

wherein first comb-shaped dielectric system, uniform dielectric system, and second comb-shaped dielectric systems are stacked together to make a stripline type of configuration, and air-pocket created between the teethes along the direction of the signal lines helps to reduce the microwave loss and increase the signal carrying capacity of the interconnects.

According to this invention, the air pockets created in between the teeth in each comb-shaped dielectric system can be aligned parallel or perpendicular in direction to each other when making the stack together to form the stripline configuration.

According to the invention, the interconnects system comprises, (i) a comb-shaped dielectric system comprising (a) a series of the teethes with certain thickness and with a certain separation between the teethe, located one side of the dielectric, (b) uniform dielectric layer left, and (c) the single or multiple signal lines located opposite side of the dielectric system either in parallel or perpendicular in direction along the teeth direction, wherein the shape of space between each teeth is quadrateral, or square or rectangular or circular, or the shape convenient in the manufacturing, and the spaces are filled with air or vacuum or low dielectric constant and low loss tangent material, and;

(ii) a uniform dielectric system carrying the ground or power plans;

wherein the two dielectric systems are stacked together to make the microstrip line type of configuration, and air-pocket created between the teeth along or perpendicular in direction of the signal lines under the signal lines, helps to reduce the microwave loss and increase the signal carrying capacity of the interconnects.

According to the invention, the interconnection system comprises, (i) a uniform dielectric system carrying single or multiple signal lines located on one side of the dielectric, and;

(ii) a comb-shaped dielectric system comprising (a) a series of the teeth with certain thickness and with a certain separation between the teeth, located one side of the dielectric, (b) uniform dielectric layer left, and (c) ground or power line located opposite side of the dielectric system, wherein the shape of space between each of the teeth is quadrateral, or square or rectangular or circular, or the shape convenient in the manufacturing, and the spaces are filled with air or vacuum or low dielectric constant and low loss tangent material;

wherein the comb-shaped dielectric system and uniform dielectric systems are stacked together to make the microstrip line type of configuration, where air-pocket created between the teeth could be positioned either in parallel or perpendicular in direction with the signal lines, and helps to reduce the loss-tangent and increase the signal carrying capacity of the interconnects.

Uniform dielectric layer left in the air-pocket, created in between two teethes of the comb-shaped dielectric system, could be no or some dielectrics left to control the interconnect bandwidth.

According to the invention, the interconnection system comprises, (i) single or multiple electrical signal lines (conductors) for carrying the electrical signals from one electronics elements to another and vice-versa for electrical communication and located on one side of the dielectric system;

(ii) a ground plan or power line is located on the same side of the dielectric system where the signal lines are laid, and;

(iii) a dielectric system comprising with the opened trenches located below the conductor and passing along the conductors, wherein the shape of the trenches are the quadrateral, or square or rectangular or circular, or the shape convenient in the manufacturing, and the trenches are filled with air or vacuum or low dielectric constant and low loss tangent material.

According to this invention, signal lines could be arranged as single ended or in differential pairs side-by-side, and each layer can have the single or multiple signal lines.

Again, according to this invention, only single ground plan or single power plan can be used for each signal plan.

According to this invention, multiple layers, in each of which has either ground/power line or signal lines, stacked together to form the multi-layered PCB.

According to this invention, opened trench of the dielectric system can be filled up with the air or kept vacuum, or alternatively filled by the liquid crystal, wherein the loss-tangent (and also dielectric constant) inside the trenches can be changed based on the electrical field, resulting in the tunable of the effective loss-tangent (and also effective dielectric constant).

Alternatively, according to the invention, the opened trench of the dielectric system is filled with photonics crystal or electronics crystal system, including periodic arrays of the dielectric sphere or cylinder with diameter and lattice constant, wherein the electromagnetic wave is propagated inhomogeneous, but non-dissipation dielectric media.

Alternatively, according to the invention, the photonics crystal or electronics crystal system could be quasi photonic (or electronic) crystal system, including a single layer or multiple layers of photonic crystals and single or multiple layers of uniform dielectric layers.

According to the invention, the interconnects system comprises, (i) single or multiple electrical signal lines (conductors) for carrying the electrical signal from one electronics elements to another and vice-versa for electrical communication;

(ii) a dielectric system comprising with the periodic arrays of air spheres or cylinder with certain diameter and the pitch into the dielectric medium, located outside and underneath the electrical signal line (conductor), and designed to handle the signal frequency, and;

(iii) a ground or power line opposite side of the dielectric system;

wherein the shape of the periodic dielectric structure could be the square or hexagonal or the shape convenient in the manufacturing.

According to the invention, the interconnects system comprises, (i) single or multiple electrical conductors for carrying the electrical signal from one electronics elements to another and vice-versa for electrical communication;

(ii) a dielectric system comprising (a) periodic arrays of air spheres or cylinder with certain diameter and the pitch into the dielectric medium, located outside the electrical signal line (conductor), and designed to handle the signal frequency;

(iii) a ground or power line opposite side of the dielectric system, and;

(iv) a dielectric system coverage on the electrical signal line (conductor);

wherein the shape of the periodic dielectric structure could be the square or hexagonal or the shape convenient in the manufacturing.

According to the invention, the interconnects system comprises, (i) single or multiple electrical conductors for carrying the electrical signal from one electronics elements to another and vice-versa for electrical communication;

(ii) a dielectric system comprising (a) periodic arrays of air spheres or cylinder with certain diameter and the pitch made into the dielectric medium, located outside and underneath the electrical signal line (conductor), and designed to handle the signal frequency;

(iii) a ground or power line opposite side of the dielectric system, and;

(iv) a dielectric system coverage on the electrical signal line (conductor);

wherein the shape of the periodic dielectric structure could be the square or hexagonal or the shape convenient in the manufacturing.

According to this invention, dielectric system includes periodic arrays of the air hole with certain diameter and pitch into the dielectric medium, and located outside of the electrical signal line (conductor).

According to this invention, the dielectric system can be rigid and/or flex in nature, appropriate to make PCB and/or flex printed circuit, respectively.

According to this invention, dielectric system includes periodic arrays of the air hole with certain diameter and pitch into the dielectric medium, located outside of the electrical signal line (conductor), and the hole is alternatively filled by the liquid crystal, wherein the dielectric constant inside the hole can be changed based on the applied electrical field, resulting in the tunable of the effective dielectric constant.

According to the invention, the dielectric system, alternatively, is based on the photonics crystal or electronics crystal system, consisting of the periodic arrays of the dielectric sphere or cylinder with diameter and lattice constant, wherein the electromagnetic wave is propagated inhomogeneously, but non-dissipation dielectric media.

Alternatively, according to the invention, the photonics crystal or electronics crystal system could be quasi photonic (or electronic) crystal system, consisting of the single layer or multiple layers of the photonic crystals and single or multiple layers of uniform dielectric layers.

According to this invention, the dielectric system is designed alternatively based on the photonic band-gap or electronic bad-gap principle or their quasi principle.

According to this invention, the electrical signal line could be microstrip type or strip line type or coplanar type waveguide.

According to this invention, the effective dielectric constant and effective loss tangent of the dielectric system is reduced, which reduce the microwave-loss and makes to increase the bandwidth of the interconnection. The lower the microwave loss, the closer the signal speed to the speed of the light.

The invention offers to connect the signal line of one electronics elements to other electronic elements to communicate without sacrificing each electronic element's signal speed. These inventions could be easily implementable using today's manufacturing technology and conventional dielectric materials. The methods described in this disclosure enables to make the electronics interconnects for on-chip, off-chip connection in cost-effective manner and suitable for practical application. These inventions also used to high-speed (bandwidth) electronic connector, and cable where two or more electronic elements are to be connected.

Another advantage of this invention is that conventional PCB manufacturing technology can be used to make the invented interconnects for off-chip interconnection. This invention can also be used to make the high bandwidth cable and connector using the conventional dielectric material and conventional manufacturing process.

According to this invention, the interconnects with opened-trench can be used to transmit the optical signal through the air or vacuum or low loss-tangent material, filled the trench. In that case, ultra high speed interconnects comprising with electrical and optical signals can be achieved. As the same trench can be used for both electrical and optical interconnects, high density can be achieved for high-speed transmission.

Another advantage of this invention is that the trench of the proposed interconnects can also be used for cooling the interconnects/board. The trench can be filled with the coolant or gas to dissipate the heat generated due to electrical signal flowing through the electrical signal lines or heat generated due to the other active (e.g. chip) and passive (resistor) component's power consumption. Similar technique also be used to cool the on-chip and cable cooling.

Another object of this invention is to minimize the skew in the signal interconnection, occurred due to the signal propagation delay, by reducing the loss-tangent.

Other objects, features, and advantages of the present invention will be apparent from the accompanying drawings and from the detailed description that follows below.

BRIEF DESCRIPTION OF THE DRAWINGS

The invention will be explained in more detail in conjunction with the appended drawings wherein:

FIGS. 1A, 1B, and 1C are the top, front and side cross-sectional views' showing prior art of electrical interconnects for off-chip connection;

FIGS. 2A and 2B are the simplified cross-sectional views of the microstrip and stripline transmission line. This is an explanatory diagram showing the prior-art based on which today's electronic interconnection is made;

FIGS. 4A, 4B, and 4C are the cross-sectional views, illustrating different microstrip configurations on the dielectric system having back trenches for electrical interconnects in a second preferred embodiment according to the invention. The microwave losses of the signal lines are dependent on the parameters such as width W, height H, deepness of the trenches H/n, where n is the integer and equal to 1, 2, 3, and so on;

FIGS. 6A, 6B, and 6C are the cross-sectional views, illustrating different strip configurations on the dielectric system having back trenches for electrical interconnects in a fourth preferred embodiment according to the invention. The microwave losses of the signal lines are dependent on the parameters such as width conductor width, height (H) of the dielectric, deepness of the trenches H/n, where n is the integer and equal to 1, 2, 3, and so on;

FIG. 7A is the top view, and FIGS. 7B and 7C are the cross-sectional views taken along AA' section, illustrating the coplanar configuration on the dielectric system having backside slot in a fifth preferred embodiment according to the invention;

FIG. 8A is the top view, and FIGS. 8B and 8C are the cross-sectional views taken along AA' section, illustrating the microstrip configuration on the dielectric system having backside slots and also the periodic structure, in a sixth preferred embodiment according to the invention;

FIGS. 10A and 10B are the enlarged front and side cross-sectional views, illustrating a portion of alternate high-speed signal lines (of stripline type transmission line) of off-chip interconnections in the eighth preferred embodiment according to the present invention. For simplicity, only the surrounding portion of signal lines is shown. Single or multiple signal lines can be laid using multilayerd PCB;

FIGS. 15A, 15B, and 15C are schematics showing the cross-sectional views of the multilayered interconnects consisting of the coplanar waveguide line and microstrip line with opened trenches containing air and also air spheres into the dielectric system in a thirteenth preferred embodiment in accordance with the invention. The hole and the trenches can be filled up by the air or vacuum, or by other dielectric material. For simplicity, only three layers interconnect are shown;

FIG. 17 is a schematic illustrating the stacking of multiple dielectric layers for microstrip type and strip line type signal lines for the PCB having the opened trenches under the signal lines in the fifteenth preferred embodiment in accordance to the present invention;

DESCRIPTION OF THE PREFERRED EMBODIMENTS

Figures 3, 3A, 3B, 3C:
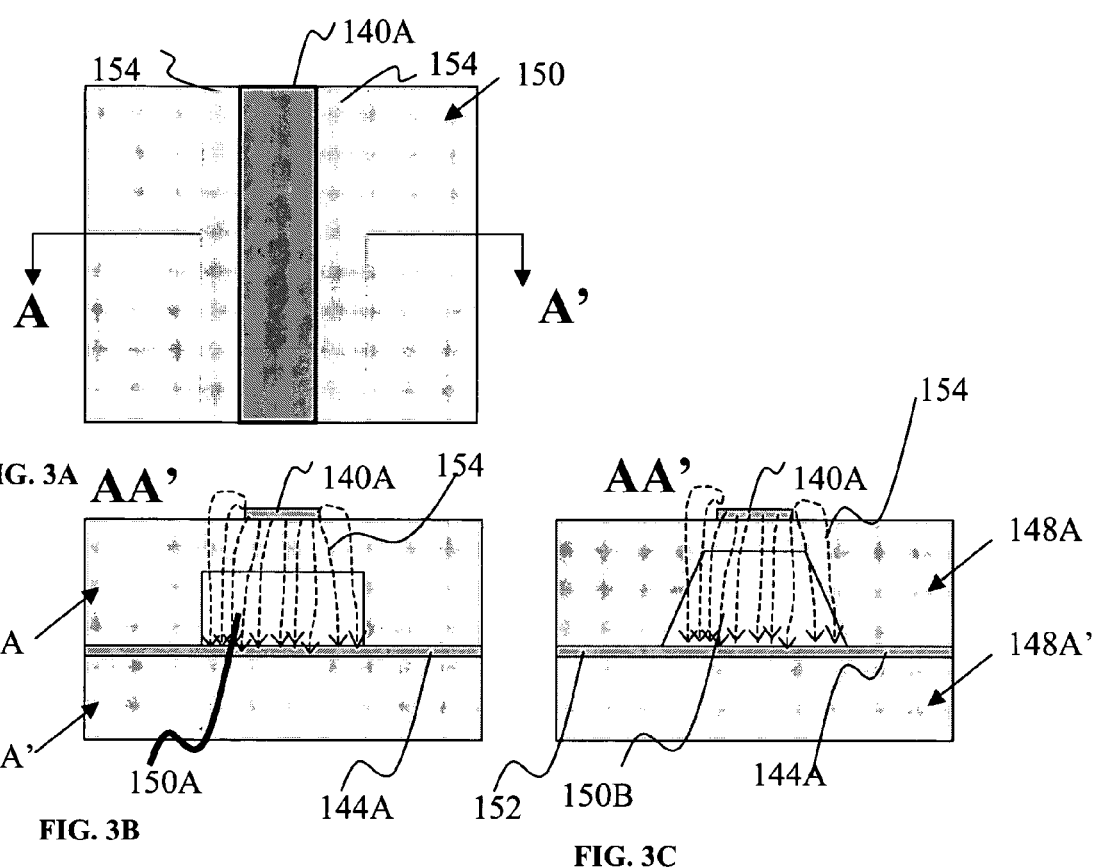
FIG. 3A is the top view.
FIGS. 3B and 3C are the cross-sectional views taken along AA' section, illustrating two microstrip configurations on the dielectric system having back trenches for electrical interconnects in a first preferred embodiment according to the invention.

The best modes for carrying out the present invention will be described in turn with reference to the accompanying drawings. In the following description, the same reference numerals denote components having substantially the same functions and arrangements, and duplicate explanation will be made only where necessary.

An important point of high speed electronic interconnect system (for off-chip and on-chip) according to the invention is that the microwave loss induced due to the dielectrics is to be reduced by reducing the effective loss-tangent of the dielectrics, resulting in increasing the signal carrying capacity of the interconnect. In doing so, the main point is kept into mind that the technique is to be cost effective, and compatible to standard manufacturing technology.

It is very straight forward that increasing interconnects (both on-chip and off-chip) bandwidth can be possible by using of the low loss-tangent material. However, new materials and related manufacturing technologies are to be developed to implement practical interconnects. It is highly desirable to invent the interconnects which have low effective loss-tangent, and which could use conventional manufacturing technology.

In the preferred embodiments explanation, first several interconnects structures (techniques) to reduce the effective loss-tangent will be explained considering the single signal line with specific characteristics impedance, and later part of this section cover the process and applications of the preferred embodiments.

FIG. 3A is the top view and the FIGS. 3B and 3C are the cross-sectional views of a portion of the interconnects system, taken along AA' direction of FIG. 3A in the first embodiment in accordance with the invention, wherein the same numerals represents the same parts so that repeated explanation is omitted here. Microstrip line as shown in FIG. 3A is laid onto dielectric system 148, having the opened trenches 150A (or 150B) into the dielectric system 148 located at the backside of the signal line 140A. The ground plan 152 is located on other dielectric system 148A'. The shape of the opened trenches 150A (and 150B) could be tetrahedral (square, rectangular or circular) or any shaped convenient for manufacturing, and the trenches are filled with the air or any dielectric materials having lower dielectric constant and lower loss tangent. This could be filled with the liquid crystal. By doing this, the refractive index can be tuned based on the electrical field. While signal flowing through the transmission line 140A (conductor), the electrical field 154 (and also magnetic field (not shown)) passes through the opened trenches and dielectric system 148A left under the transmission line 140A. As the electrical field 154 is passing through the opened trenches containing the air and the less dielectric layer, the effective dielectric constant and effective loss tangent of the structure as shown in FIG. 3, gets much more lower than those of actual dielectric material used in dielectric system 148A. This results in reducing the microwave loss (experienced due to the dielectrics) as compared with that of the conventional uniform dielectric system (not shown). In other words, signal transmission is less dispersive, and higher bandwidth of the interconnect system is ascertained, as compared with the conventional interconnects where signal conductor is laid onto the uniform dielectric medium.

Based on the shape and physical parameters of the opened trenches, the microwave loss experienced due to the dielectric system, can be made as low as close to the air. In the preferred embodiment, the dielectric is left under the conductor, to reduce microwave loss as close to air, the opened trenches could be extended to the conductor.

Figure 4C:
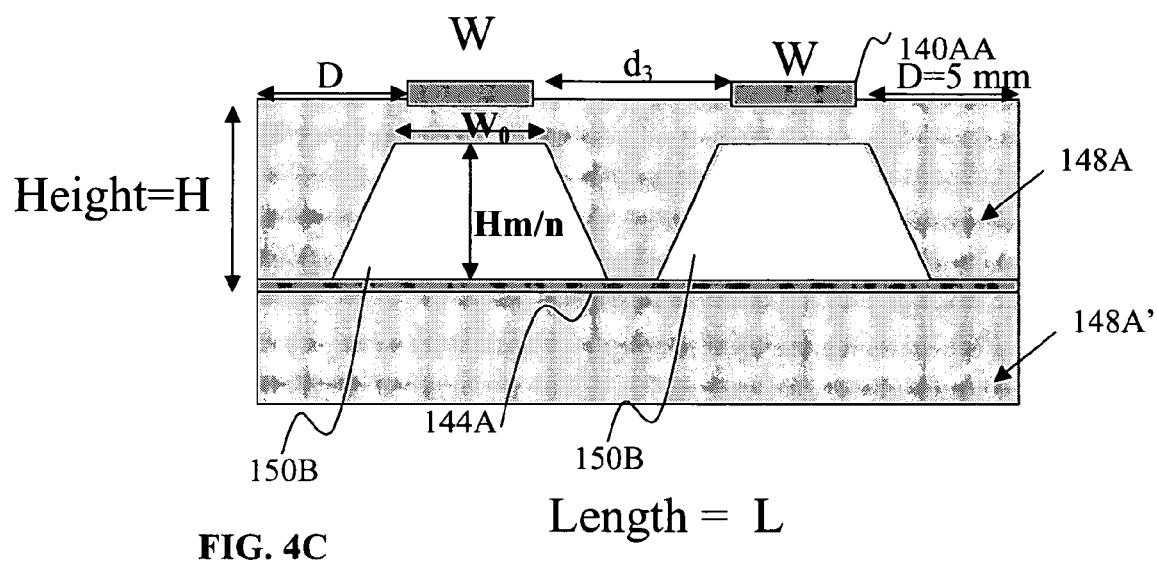

FIGS. 4A, 4B, and 4C are the cross-sectional views, illustrating different microstrip configurations on the dielectric system having back trenches for electrical interconnects in a second preferred embodiment according to the invention, wherein the same numerals represent the same parts so that repeated explanations are omitted here. Different microstrip lines structures such as single ended and differential pars with opened trenches are shown. For simplicity, single pairs and also single-ended (single channel) microstrip type signal lines are shown, but in actual application multiple signal lines could also be used in multilayered dielectric layers. The microwave losses of the signal lines are dependent on (a) conductor width W 140A (designed to have close to 50 ohm for the single-ended, and close to 100 ohm for the differential pairs lines) and (b) trench 150B parameters such as dielectric height (from ground plan to conductor) H, deepness of the trenches Hm/n, where n and m are the integer and equal to 1, 2, 3, and so on. For the differential pair lines, space between the differential line ($d_2$ or $d_3$) determines the microwave loss. Optimizing the each factors, will determine the low microwave loss and low signal propagation delay. For simplicity one type of trenches are shown here, but it can cover other shapes of the trench such as square, rectangular, or circular, or the shape convenient to manufacturing. Again, here the trench is filled with the air (or gas) or kept vacuum, but other dielectric materials with suitable dielectric constant and loss tangent can also fill it.

Figure 5:
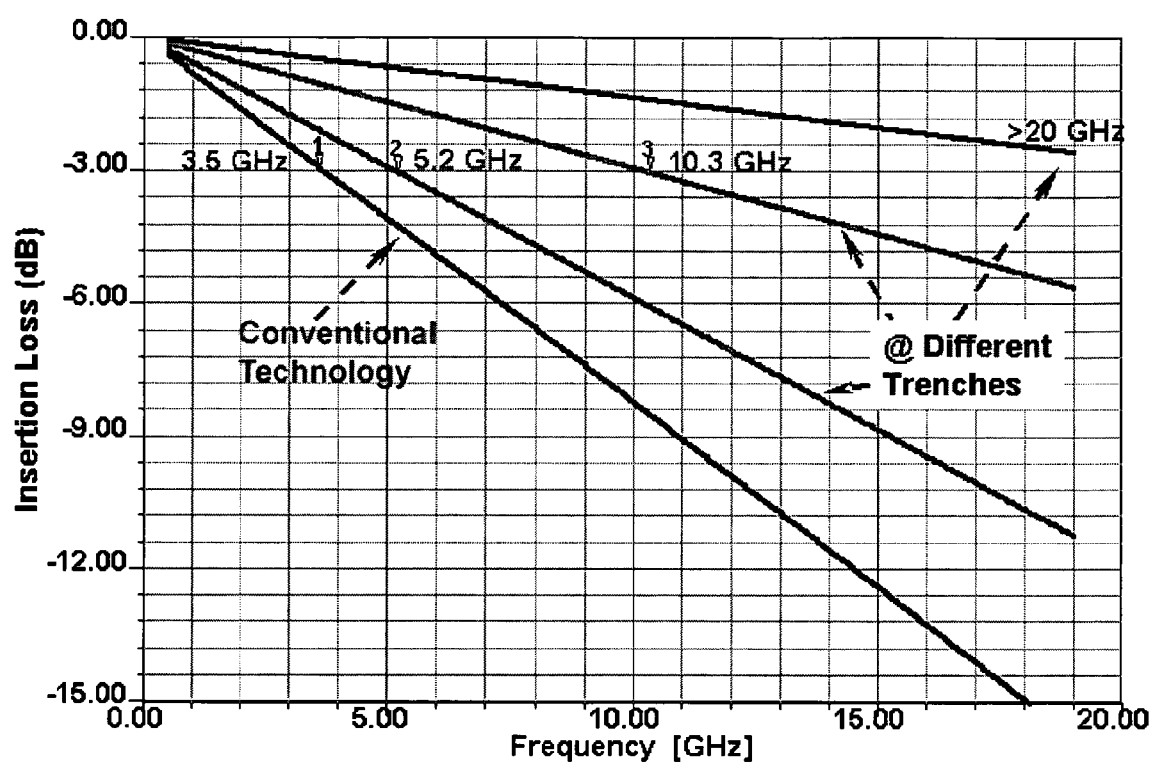
FIG. 5 is the insertion loss (S21) of the conventional signal line (homogeneous dielectric) and the signal lines with different trenches shape inside the dielectric system in a third preferred embodiment according to the invention. The data shown is for the 300 mm long microstrip type signal line of type as shown in FIG. 5A.

FIG. 5 is the insertion loss (S21) of the conventional signal line (homogeneous dielectric) for example the case as shown in FIG. 2 as prior art, and the signal lines with different trenches shape inside the dielectric system, as shown in FIG. 4A, in a third preferred embodiment according to the invention. The data shown is for the 300 mm long microstrip type signal line. Depending on the parameters chosen the insertion loss can be changed and the bandwidth of the interconnects can be increased. Ideally, the speed of the signal can be made to closer to the speed of the light. With varying the parameters of the opened trenches, the effective dielectric constant and effective loss tangent of the dielectric system can be made to lower as compared with the actual dielectric materials of the dielectric system.

Figure 6A:
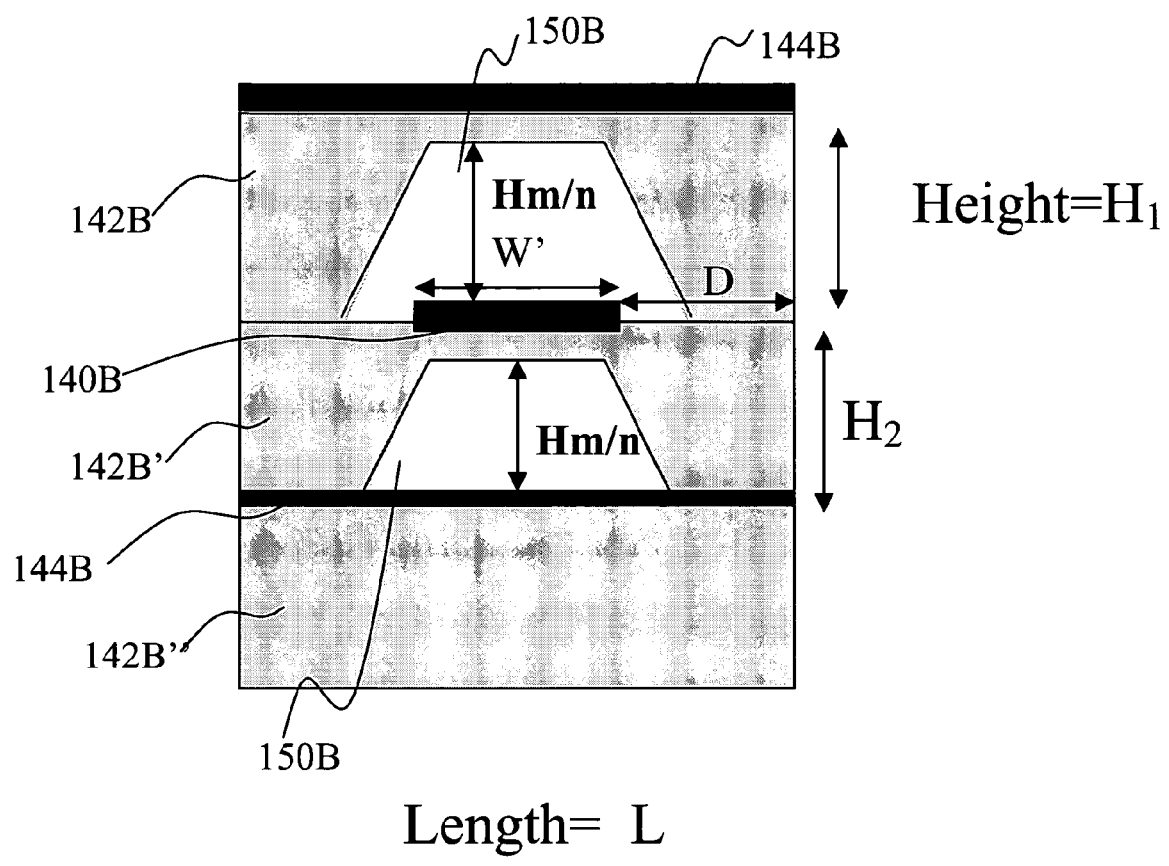
Figure 6B:
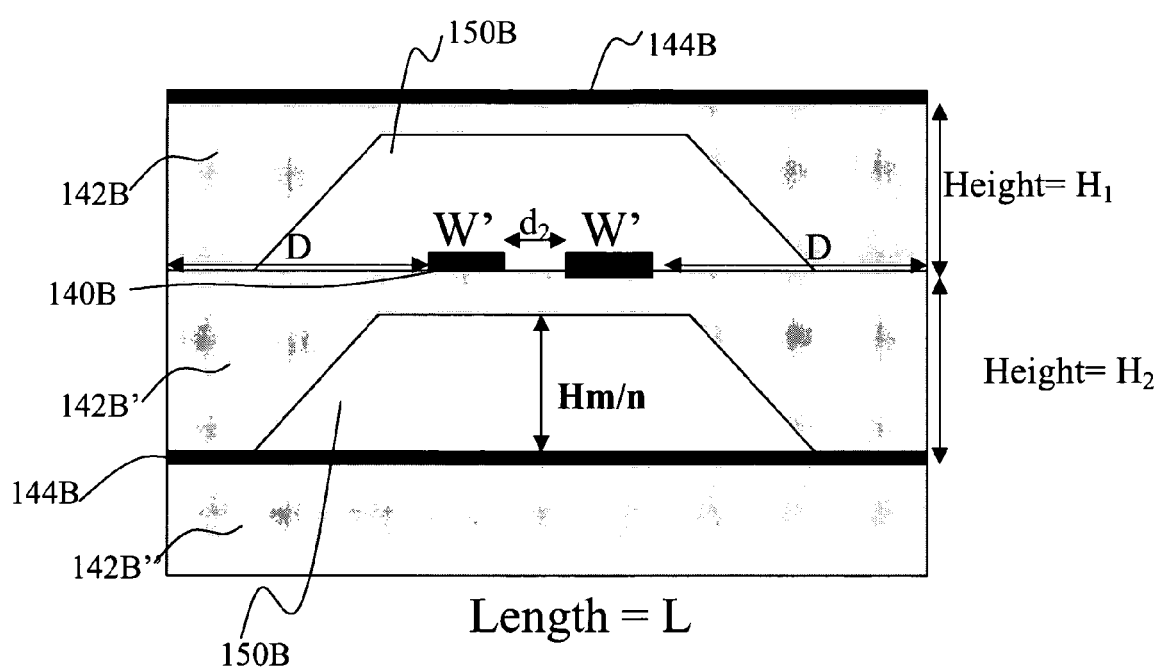
Figure 6C:
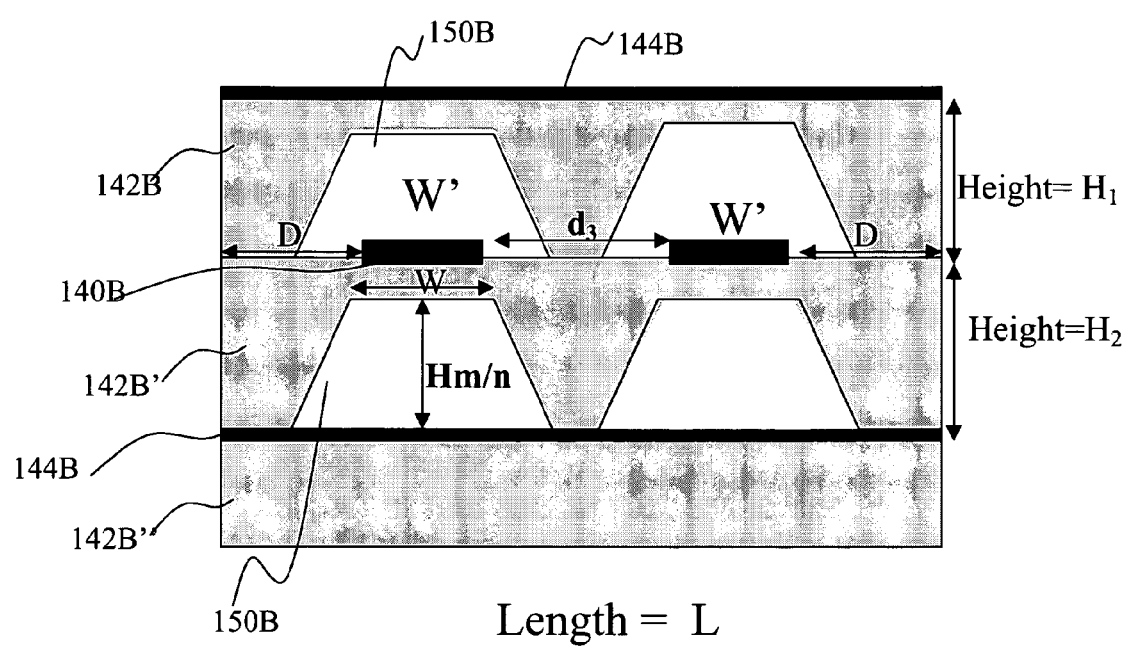

FIGS. 6A, 6B, and 6C are the cross-sectional views, illustrating different strip line configurations on the dielectric system having opened back trenches for electrical interconnects in a fourth preferred embodiment according to the invention, wherein the same numerals represent the same parts so that similar explanations are omitted here. For simplicity, single pairs and also single-ended (single channel) stripline type signal lines are shown, but in actual application multiple signal lines could also be used in multilayered dielectric layers. The microwave losses of the signal lines are dependent on the (a) conductor width W 140B (designed to have close to 50 ohm for the single-ended, and close to 100 ohm for the differential pairs lines) and (b) opened trenches 150B parameters such as dielectric height (from ground plan to conductor) $H_1$ and $H_2$, deepness of the trenches Hm/n, where n and m are the integer and equal to 1, 2, 3, and so on. For the differential pair lines, space between the differential line ($d_2$ or $d_3$) determines the microwave loss. Optimizing the each factors, will determine the low microwave loss and low signal propagation delay. For simplicity one type of trenches are shown here, but it can cover other shapes of the trench such as square, rectangular, or circular, or the shape convenient to manufacturing. Again, here the trench is filled with the air, but other dielectric materials with suitable dielectric constant and loss tangent can fill it.

FIG. 7A is the top view and the FIGS. 7B and 7C are the cross-sectional views of the portion of the interconnection system, taken along AA' direction of FIG. 7A, in the fifth preferred embodiment in accordance to the present invention, wherein like parts are indicated by like reference numerals as used in FIGS. 4 and 6, so that repeated explanation is omitted here. In FIG. 7A, the coplanar line configuration consisting of signal line 140C and both sides ground 144C is used on dielectric system 142C with back-side slotted (150A or 150B', or 150B (not shown)). According to this invention the effective dielectric constant (i.e. microwave index) and effective loss tangent is considerably decreased, and the electrical field intensity near to the signal line. The reason is as follows: (i) the electric field leaks out effectively into the backside (air) so that the effective dielectric constant (microwave index) and effective loss tangent decrease. For simplicity, signal lines consisting of the ground-signal-ground (G-S-G) configuration is shown, various configurations such as G-S-S-G or G-S-G-S-G or G-S-S-S-G etc. having opened trenches also cover this invention.

Dielectric material, which can be used for this purpose, includes all kinds of dielectric and ceramics materials such as $SiO_2$, SiN, FR4, Duroid, AlN, $Al_2O_3$, BN, SiC, BeO, and all kinds of low temperature cofired ceramics etc. All kinds of polymer materials having dielectric properties also falls under this dielectric material. These dielectric materials can be made using high (or low) temperature ceramics processing or using the IC fabrication process. In FIG. 7, backside opened-trench portion 150A or 150B' or 150B (not shown) is filled up with the air (or gas) or vacuum as for example. Instead of air (or gas), the backside opened-trench portion can be filled up with the dielectric material having lower loss-tangent properties than the dielectric system 142C.

FIG. 8A is the top view, and FIGS. 8B and 8C are the cross-sectional views taken along AA' section, illustrating the microstrip configuration on the dielectric system having backside slots and also the periodic structure, in a sixth preferred embodiment according to the invention, wherein like parts are indicated by like reference numerals as used in FIGS. 4, 6, and 7, so that repeated explanation is omitted here. In FIGS. 8A, 8B, and 8C, the microstrip line configuration consisting of signal line 140E and back-side ground 144E, is used on dielectric system 142E consisting of the dielectric sphere (i.e. air) or cylinder 160 with diameter 2r and span a, and backside slot (trenches) 150A (or 150B). According to this invention the effective loss-tangent of the dielectric system is considerably decreased. This also reduces the effective dielectric constant (i.e. microwave index) of the dielectric system. The electrical field intensity under the trenches can be localized.

The spheres 160 array into the dielectric, as shown in FIG. 8, could be air (or gas or vacuum) hole (with cylindrical in shape) or any other material having the lower loss-tangent than the surrounding dielectric media. Each cylinder (sphere) constitutes the cell, and hereafter mentioned the single cylinder as circular cell. Each circular cell (not shown) again can be arranged in triangular or square (not shown) way. The arrangement of the each cell here after mentioned as the lattice. According to this invention, the circular cell contains air with low dielectric constant, and is formed inside the dielectric material with higher dielectric constant. The electric field from the signal line can made to pass through the air cell, reducing the effective dielectric constant and also reducing effective loss tangent, which results in increasing the bandwidth of the interconnects. Based on the parameters of diameter and the span, the electrical field distribution can be concentrated into the dielectrics system with air-holes array.

In the preferred embodiment, the circular cells with triangular and square-lattice structures are mentioned. It also includes the elliptic unit cell with square or triangular-lattice structure. In the case of the cell, the shape of circle, or square or ellipse can be used to tune the dielectric constant along with the loss tangent in the same dielectric layer. This helps to add many passive features in the interconnection such as varying the phase velocity (which is function of the dielectric constant), varying the bandwidth of the interconnect; help to adjust the skews of the signal etc. in the single interconnect system. In addition, various passive features such as the emphasis and also equalizations feature can also be made varying the dielectric constant along the path where the signal flow from transmitter to receiver.

In the preferred embodiment, the microstructure configuration with single electrode of microstrip line type is shown as signal line, the present invention also include other configurations such as strip line or coplanar type or other configuration reducing the effective dielectric constant and effective loss tangent. Single or multiple electrodes with single or multiple layers of the dielectric could also be used.

According to the preferred embodiment, ideally, the bandwidth of the electronic interconnect system can be possible to make the closer to fiber (closer to the light), if other loss due to the signal line structure such as the electrode parameter (resistance, capacitance) are neglected.

The dielectric system mentioned in the preferred embodiment also includes the photonic crystal structure (2-Dimensional and 3-Dimensional) comprising with the dielectric periodic structure and the line defect for the signal line layout. The band-gap is formed due to use of the lower dielectric material cylinder into the dielectric substrate with comparatively higher dielectric constant. In the structure, the electrical field created from the high-speed signal, flowing through the signal line (not shown) is confined and controlled in the n-plan direction by the 2D photonic band gap effect. The electrical field can be localized completely in the air-hole along the signal flowing direction making the low effective dielectric constant (low microwave loss), and thereby increasing the bandwidth of the interconnect system. By changing the shape of the cylinder for example elliptic and its different size and their span, the electrical field can be localized in the dielectric slab. This allows to have the different interconnect system having the different bandwidth by changing the dielectric constant, and signal can be made slow and high speed where it necessary. According to the preferred embodiment, the interconnect can be designed ideally having the bandwidth closer to optical fiber, and carry the high-speed electronics signal (even terahertz level). In the example, the dielectric system consisting of the 2D photonic crystal is shown. Present invention also includes the 3D photonic crystal for high-speed interconnect systems applying in the on-chip and off-chip application. This also includes the means such as the connector and cable used to high-speed connection of electronic elements covering transistor to instruments.

According to the preferred embodiment, the interconnect system can be fabricated as follows; first a layer of cylindrical holes are made into a dielectric substrate. Standard PCB manufacturing technology for off-chip interconnection can be used for this purpose. This is followed by the formation of the signal line. The hole can be made underneath the signal line or that portion is masked while opening the holes outside the signal line. In the preferred embodiment alternatively, the lower loss-tangent material as compared with the dielectric substrate can fill up the hole.

Figure 9A:
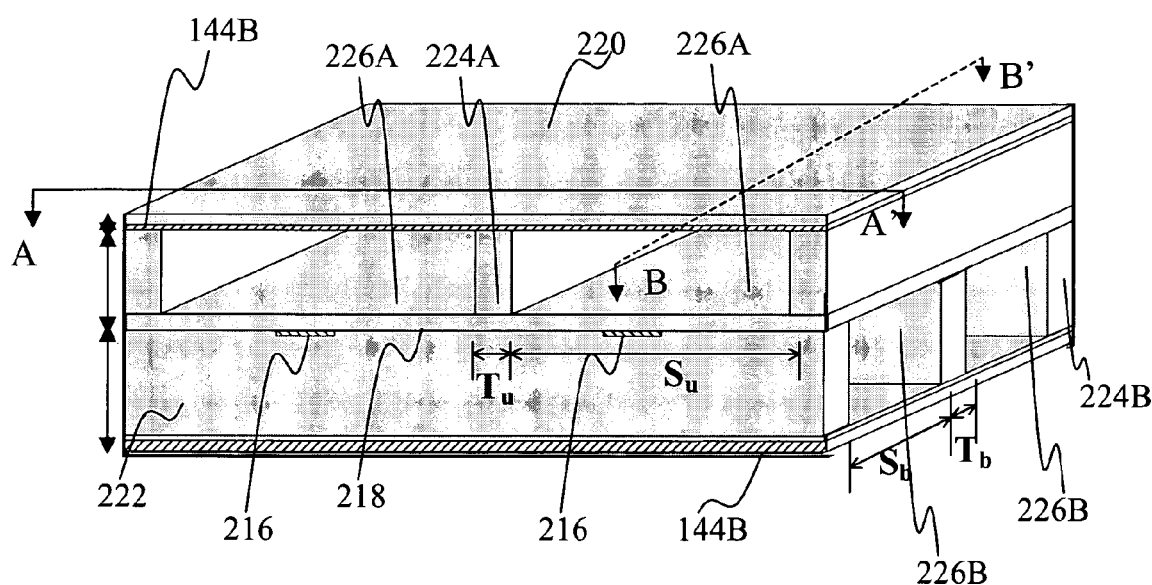
FIGS. 9A is the schematic and 9B and 9C are the enlarged front and side cross-sectional views along AA' and BB' directions of FIG. 9A, illustrating a portion of the high speed signal lines (of stripline type transmission line) of off-chip interconnections in the seventh preferred embodiment according to the present invention. For simplicity, only the surrounding portion of signal lines is shown. Single or multiple signal lines can be laid using multilayerd PCB.
Figure 9:
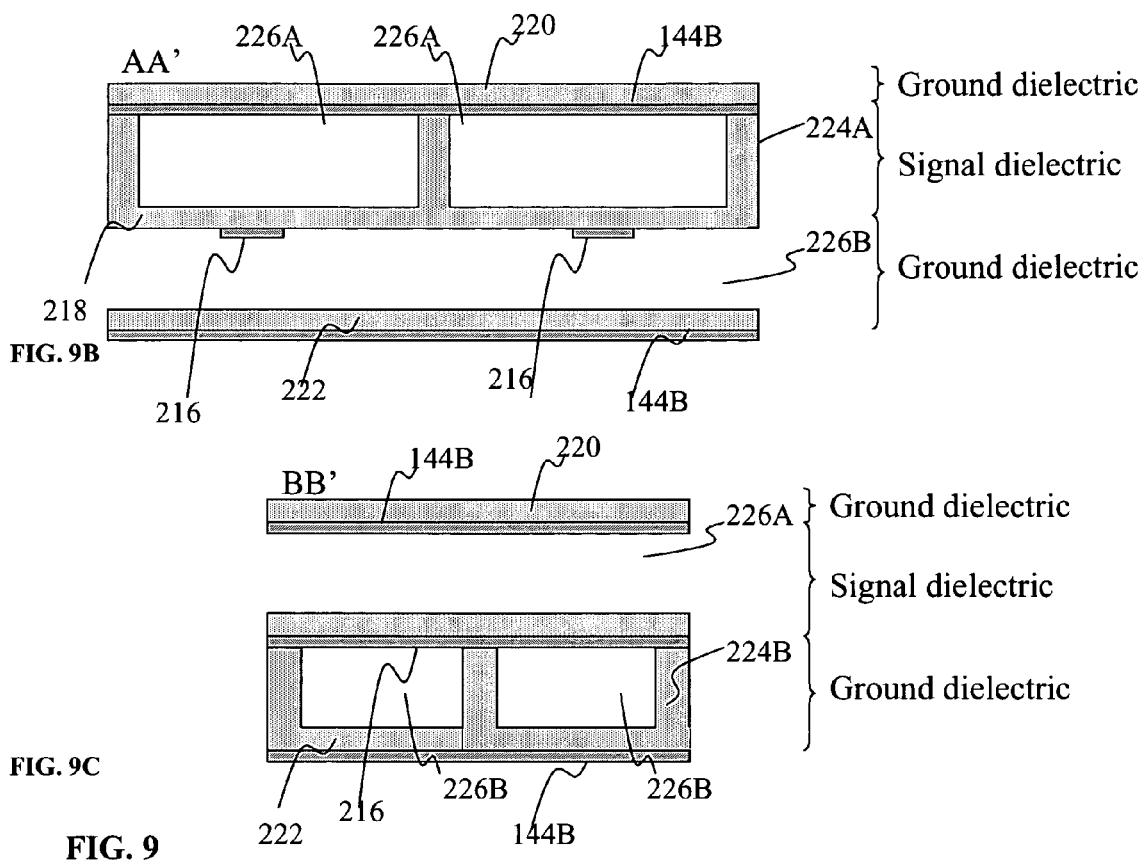

FIG. 9A is the schematic and 9B and 9C are the enlarged front and side cross-sectional views along AA' and BB' directions of FIG. 9A, illustrating a portion of the high speed signal lines (of stripline type transmission line) of off-chip interconnections in the seventh preferred embodiment according to the present invention. For simplicity in drawing, only the surrounding portion of signal lines is shown. In the preferred embodiment, two single-ended strip lines 216 are shown as the high-speed signal lines, and the signal lines are laid on one-side of the "comb" shaped dielectric substrate 218, the other side of which has the "teeth". The "comb" shaped dielectric substrate having signal line 216 in one side, is sandwiched by a top thin uniform dielectric substrate 220 having ground plan 144B and the bottom "comb"-shaped dielectric substrate 222 having ground plan 144B, to make the stripline configuration. As the "Comb" shaped dielectric substrate 218 signal line is located at the top of other comb-shaped dielectric substrate 222 having the ground plan 144B, hereafter (for explanation of FIG. 9), the signal line substrate is called as the top and bottom comb-shaped dielectric is called as Bottom dielectric. Each "Comb"-shaped dielectric substrate (218 and 222) has the series of the "teethes" 224A (for signal line) and 224B (for bottom), having the space of $S_b$ (for bottom) and $S_u$ (for up) between the teeth, and the teeth thickness of $T_b$ (for bottom) $T_u$ (for up). Both dielectric systems are stacked the signal line substrate in a way that the teeth position of the top and the bottom dielectric systems are 90 degrees to each other to have strong support, and their opening portion is facing in the same direction. For example, in FIG. 9, the teeth for both upper and bottom dielectrics are directed in upward direction. The signal line is laid in between the space between the teeth, and the comb helps to make strong mechanical support (see FIG. 9A). Using of comb shaped dielectrics 218 and 222 will make the air pockets 226A and 226B along the conductor path in both upper and bottom side of the signal lines 216 (see FIGS. 9B and 9C). Having larger volume of air space (top and bottom) as shown in FIG. 9, the signal flows at the speed closer to the speed of the light. Based on the requirements of the signal carrying capacity of the interconnects and also requirements of the mechanical support based on the applications, the spaces between comb $S_b$ and $S_u$ and their thickness $T_b$ and $T_u$ (for both bottom and upper dielectrics) can be designed. In the preferred embodiment, the comb-shaped dielectric substrate can be made after metallization, and it could be done standard process, such as mechanical drilling, or laser drilling. Etching process either wet or dry etching can also be used after patterning, and conventional etching process used frequently in manufacturing can be used. The dielectric substrate with metallization can be stacked using conventional PCB manufacturing process.

According to this invention, for simplicity, only one arrangement of teeth position and signal line position are shown in FIG. 9, several different configurations for the teeth and signal lines (not shown) for different positions of the signal line and teeth of upper and lower dielectric system can be thought. In FIG. 9, the teeth of upper dielectric substrate is positioned from left-right (vice-versa) direction along the substrate and the signal line is passing in between the teeth, that is, signal line is front-back (vice versa) direction. Whereas, the teeth of the bottom dielectric is positioned front-back direction (just opposite to those of upper dielectric). Other different configurations can be thought.

In the preferred embodiment as shown in FIG. 9, teeth of the top comb-shaped dielectric system is placed parallel to the signal line and the teeth of the bottom comb-shaped dielectric system is in perpendicular to the signal line. Different configuration of arrangement can be possible. For example, both comb-shaped dielectric system can be positioned in parallel to the signal line, and both comb-shaped can be positioned perpendicular to the signal lines.

Other combination for placing signal lines on the dielectric system can also be possible. One of the example (not shown) could be the teeth of the upper substrate is front-back (vice-versa) direction, and the signal line is laid along the direction of left right (vice-versa). According to this invention, alternatively, different shape for the dielectric substrate (ground and signal lines) could be thought. One of the examples is the configuration, as shown in FIG. 10, with just opposite to FIG. 9. In FIG. 10, comb-shaped signal substrate 228, sandwiched by the comb-shaped ground substrate 230 (top side) and the thinner ground substrate 232 at the bottom side. In the eighth embodiment, as shown in FIG. 10, the position of the thinner ground plan is located at the bottom and in FIGS. The thinner dielectric substrate is located at the top. Also the teeth direction is downward in FIG. 10, whereas in FIG. 9 the teeth are in upward direction.

In the preferred embodiment, a portion of the signal line (strip lines configuration) structure is shown for explanation purpose. According to this present invention, the structure, as shown in FIG. 9, is only made closer to the high-speed signal lines, and outside of the signal lines standard structure with uniform multilayered dielectric system can be used. This structure is for the reducing the effective dielectric constant and effective loss tangent of the dielectric system, which results in increasing the signal carrying capacity of the interconnects and also reduce the signal propagation delay between the channels, help to eliminate the skews between the channels. This structure help to eliminate the using of the pre-emphasize/equalization circuit and more simplify the board design in the case of the off-chip interconnects.

Figure 11A:
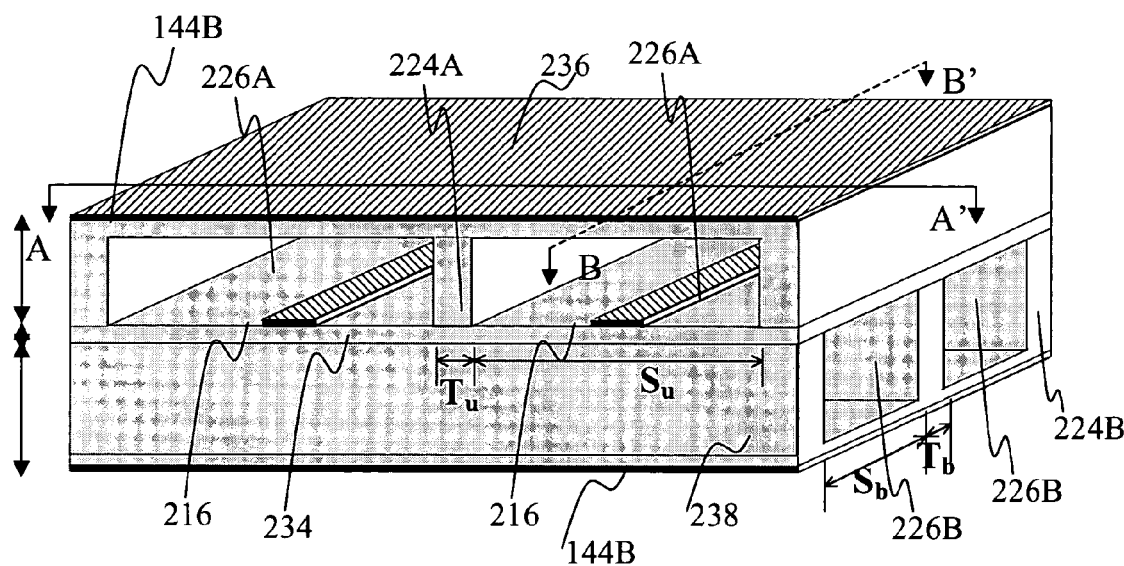
FIG. 11A is the schematic and 11B and 11C are the enlarged front and side cross-sectional views along AA' and BB' directions of FIG. 11A, illustrating a portion of alternate high speed signal lines (of stripline type transmission line) of off-chip interconnections in the ninth preferred embodiment according to the present invention. For simplicity, only the surrounding portion of signal lines is shown. Single or multiple signal lines can be laid using multilayerd PCB.
Figure 11:
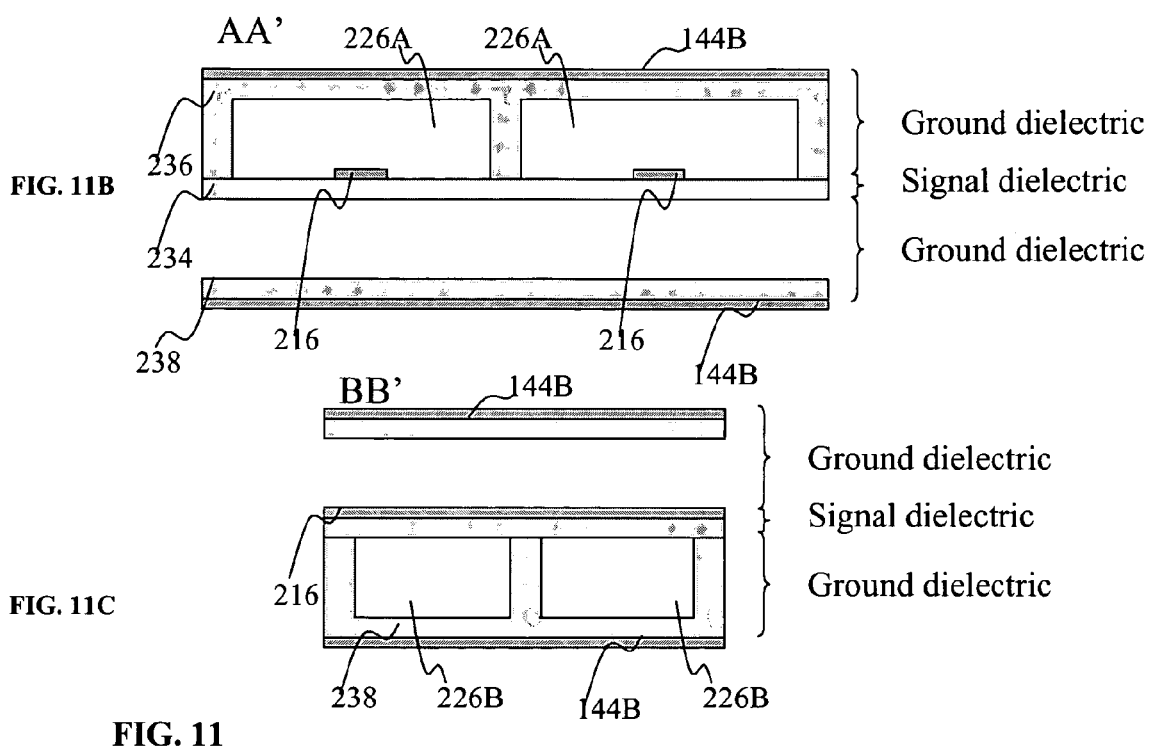

FIG. 11A is the schematic and 11B and 11C are the enlarged front and side cross-sectional views along AA' and BB' directions of similar to FIG. 11A, illustrating a portion of the high speed signal lines (of stripline type transmission line) of off-chip interconnections in the ninth preferred embodiment according to the present invention, wherein the same numerals represent the same parts as explained in FIGS. 6, 9, and 10, so that repeated explanation is omitted here. For simplicity, only the surrounding portion of signal lines is shown. In the preferred embodiment, two single-ended strip lines 216 are shown as the high-speed signal lines, and the signal lines are laid on the thin dielectric substrate, as explained in FIG. 9. The schematic of FIG. 9 and FIG. 11 have the same signal line structure (after stacking). The structure is almost the same as that of FIG. 9, only differences in FIG. 11, are the structure of dielectric substrate carrying the signal lines and the dielectric substrate carrying the ground plans. In the preferred embodiment, the thin-signal line dielectric substrate 234 is sandwiched by two "comb" shaped dielectric substrates 236 and 238 having the ground plans 144B (to make it strip line configuration) in one side of each dielectric substrate systems (236 and 238). The process and also the design such as the space between the teeth and the thickness of the teethes for both upper dielectric 236 (carrying the ground plan) and bottom dielectric 238 carrying the ground), are the same, as explained in FIG. 9, so that repeated explanation is omitted herewith.

Figure 12A:
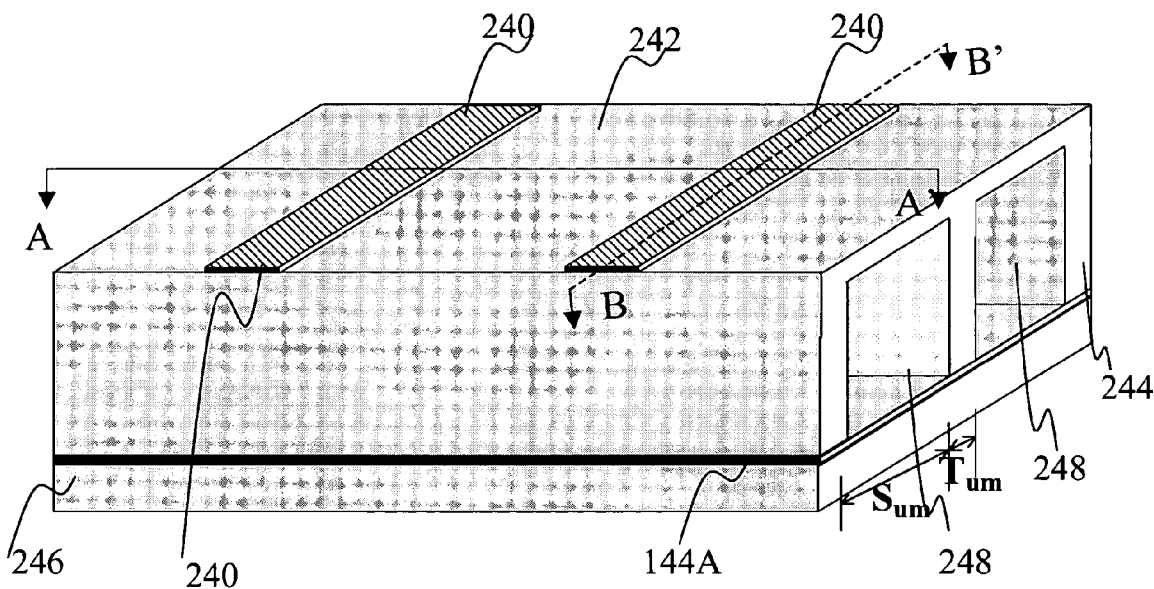
FIG. 12A is the schematic and 12B and 12C are the enlarged front and side cross-sectional views along AA' and BB' directions of FIG. 12A, illustrating a portion of the high speed signal lines (of microstrip type transmission line) of off-chip interconnections in the tenth preferred embodiment according to the present invention. For simplicity, only the surrounding portions of signal lines are shown. Single or multiple signal lines can be laid using multilayerd PCB.
Figure 12:
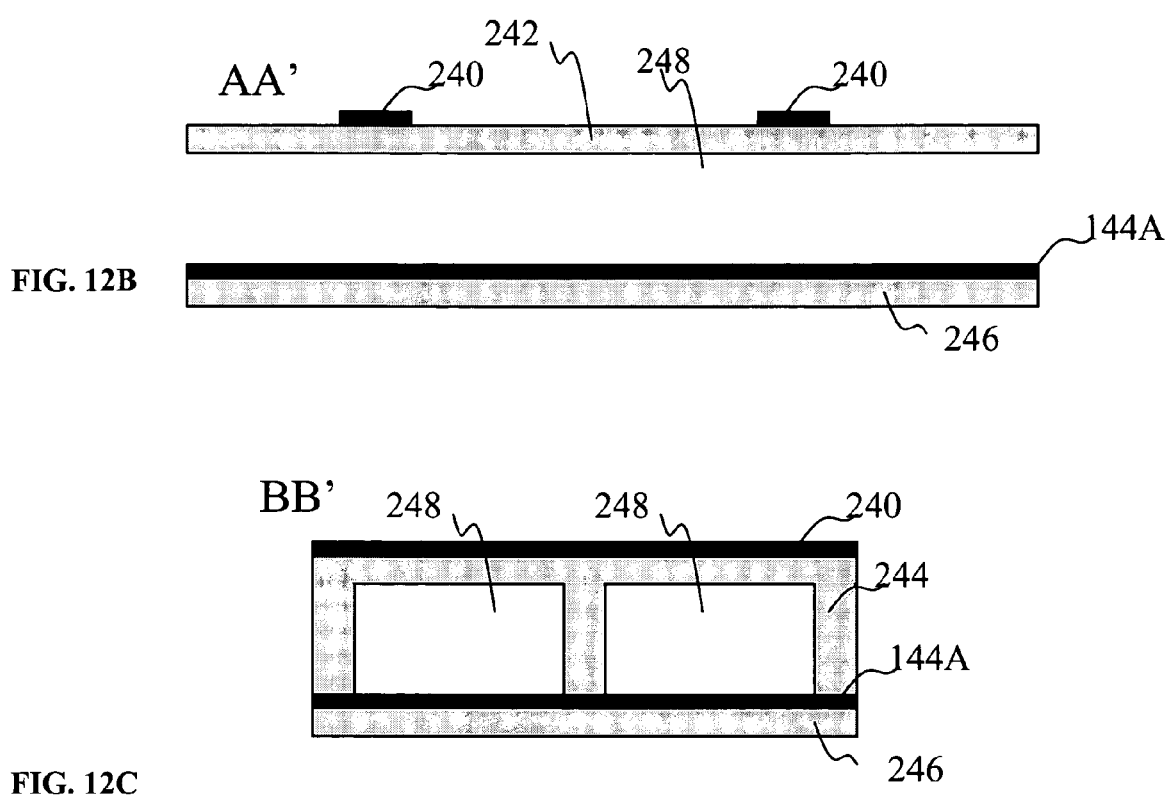

FIG. 12A is the schematic and 12B and 12C are the enlarged front and side cross-sectional views along AA' and BB' directions of FIG. 12A, illustrating a portion of the high speed signal lines (of microstrip line type transmission line) of off-chip interconnections in the tenth preferred embodiment according to the present invention. For simplicity in drawing, only the surrounding portions of signal lines are shown. In the preferred embodiment, two single-ended strip lines 240 are shown as the high-speed signal lines, and the signal lines are laid on one-side of the "comb" shaped dielectric substrate 242, the other side of which has the series of "teeth" 244. The "comb" shaped dielectric substrate having signal line 240 in one side, is stacked with uniform dielectric substrate 246 having ground plan 144A to make the microstrip line configuration. The "Comb"-shaped dielectric substrate 240 has the series of the "teethes" 244 having the space of $S_{um}$ between the teeth, and the teeth thickness of $T_{um}$. The signal line is laid in between the space between the teeth, and the comb helps to make strong mechanical support (see FIG. 12). Both dielectric systems 242 and 246 are stacked in a way that the teeth position could be left right (vice versa) or front-back (vice versa) (FIG. 12C), mainly dependent on the design of the routing. The comb's opening portion is in downward direction. Using of comb shaped dielectrics 240 will make the air pockets 248 along the conductor path in bottom side of the signal lines 240 (see FIGS. 9B and 9C). Having larger volume of air space (top and bottom) as shown in FIG. 12, the effective dielectric constant and effective loss tangent of the dielectric system can be made to close to 1 and 0.0, and the signal flows can be made to the speed closer to the speed of the light. In the configuration as shown in FIG. 12 with thin dielectric left under the signal line 240, the electrical wave can be mostly concentrated in the air pockets, and the signal microwave loss can be reduced tremendously. Based on the requirements of the signal carrying capacity of the interconnects and also requirements of the mechanical support based on the applications, the spaces between comb $S_{um}$ and their thickness $T_{um}$ can be designed. In the preferred embodiment, the comb-shaped dielectric substrate can be made after metallization, and it could be done standard process, such as mechanical drilling, or laser drilling. Etching process either wet or dry etching can also be used after patterning, and conventional etching process used frequently in manufacturing can be used. The dielectric substrate with metallization can be stacked using the conventional PCB manufacturing process.

Figure 13A:
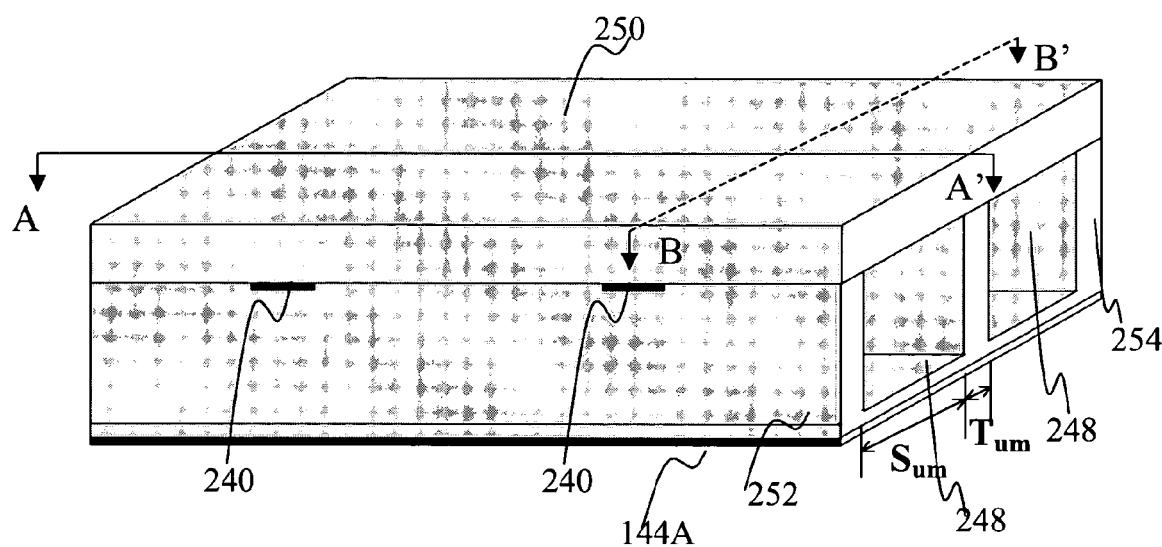
FIG. 13A is the schematic and 13B and 13C are the enlarged front and side cross-sectional views along AA' and BB' directions of FIG. 13A, illustrating a portion of alternate high speed signal lines (of microstrip type transmission line) of off-chip interconnections in the eleventh preferred embodiment according to the present invention. For simplicity, only the surrounding portions of signal lines are shown. Single or multiple signal lines can be laid using multilayerd PCB.

According to this invention, for simplicity, only one microstrip structure with comb-shaped and uniform dielectric substrate are shown in FIG. 12, According to this invention, alternatively, different shape for the dielectric substrate (ground and signal lines) could be thought. One of the examples is the configuration, as shown in FIG. 13, with just opposite to FIG. 12. In the eleventh embodiment, as shown FIG. 13, uniform signal dielectric substrate 250 having the signal line directed towards downward direction, is stacked with comb-shaped dielectric substrate 252 having opening portion is directed in upward direction and the ground plan 144A is in opposite side of the comb-shaped substrate 252. The teethes 254 is in upward direction and the teethes 254 of comb-shaped dielectric substrate 252 directly touch the signal dielectric substrate 250. As explained in FIG. 12, the teeth can be arranged in a direction of front-back (FIG. 13) or left right (vice versa), and the signal line (trace) 240 is in between the teeth.

In the preferred embodiment, a portion of the signal line (strip lines configuration) structure is shown for explanation purpose. According to this present invention, the structure, as shown in FIGS. 12 and 13, are only made closer to the high speed signal lines, and outside of the high-speed signal lines, standard structure with uniform multilayered dielectric system can be used. This structure is for the reducing the effective dielectric constant and effective loss tangent of the dielectric system, which results in increasing the signal carrying capacity of the interconnects and also reduce the signal propagation delay between the channels, help to eliminate the skews between the channels. This structure help to eliminate the using of the pre-emphasize/equalization circuit and more simplify the board design in the case of the off-chip interconnects.

Figure 14:
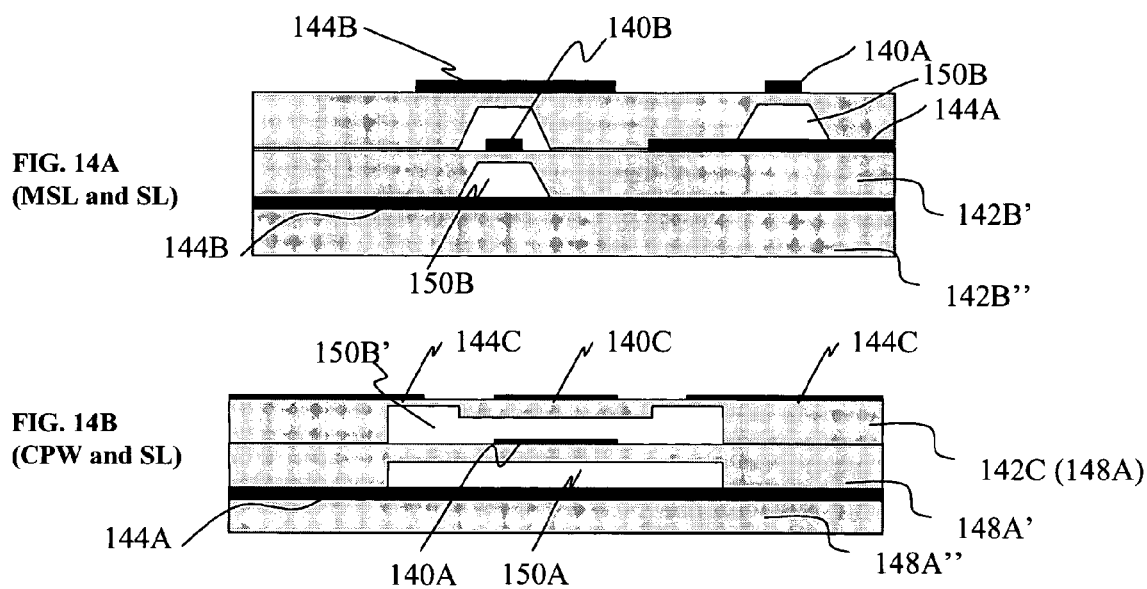
FIGS. 14A and 14B are the schematics showing the cross-sectional views of the multilayered interconnects consisting of the coplanar waveguide line and microstrip line with opened trenches containing air into the dielectric system in a twelfth preferred embodiment. The trenches can be filled up by the air, or vacuum, or by other dielectric material. For simplicity, only three layers interconnect are shown.

FIGS. 14A and 14B are the cross-sectional views of three layers ceramic sheets having the dielectric structure as explained in FIGS. 4 to 13, in the twelfth embodiment, wherein the like parts are indicated by the like numerals so that repeated explanations are omitted here. For simplicity, three layers of the PCB along with three layers of the conductors are shown with different types of the transmission lines. Multi-layered arrangement could be possible for the signal lines. Opening trenches can be done before or after stacking the ceramic layers. Other processes such as metallization, stacking, and lamination can be carried out as the same way as the conventional multilayered PCB manufacturing process. The details of the manufacturing process will be explained later.

FIGS. 15A, 15B, and 15B are the cross-sectional views of three layer ceramic sheet having the dielectric structure as explained in FIGS. 4 to 13, in the thirteenth embodiment, wherein the like parts are indicated by the like numerals so that repeated explanations are omitted here. For simplicity, three layers of the PCB along with three layers of the conductors are shown with different types of the transmission lines. Multi-layered arrangement could be possible for the signal lines. Opening trenches can be done before or after stacking the ceramic layers. The explanation is the same as those of FIG. 14, only differences are the periodic structure of the air holes array are used into the dielectric (ceramic) system as explained in FIG. 8. The repeated explanations are omitted here.

According to the present invention, it is our object to control the electrical field to reduce the effective loss-tangent which thereby reducing the microwave loss induced due to the dielectrics and increasing the interconnect bandwidth. In the preferred embodiments as explained above from FIGS. 3 to 13, single signal line in different microstrip, stripline and coplaner line configurations are shown in the object of explaining the inventions. These inventions also cover single or multiple signal lines in micro-stripline, strip line, coplanar-line configurations. Signal lines in these cases could be single or differential line.

It is noted here that the trench under the metal electrode or the periodic holes into the dielectric system can also be used for optical signal transmission; a viable high speed electrical and optical or optical interconnects solution for very high-speed on-chip interconnects. Comparatively high-speed electrical signal after converting into optical signal can be transmit through the trenches and the similar speed or slower speed can be sent through the electrical conductors laid on the dielectric system (not shown). Alternatively, periodic structure of air (gas or vacuum)-holes unto the dielectric system or photonics crystal or quasi phonics structure can be used to transmit the optical signal through the dielectric and/or comparatively lower speed or similar speed electrical signal can be passed thought the electrical conductor laid on the dielectric system (not shown).

According to this invention, the different feature for example, emphasize/equalization features can also be designed passively on-chip level by controlling the dielectric constant of the board along the signal lines utilizing the dielectric systems comprising the single or multiple combination of the dielectrics as shown in FIGS. 3 to 13. The dielectric constant (and also the loss tangent) along the signal lines located in the dielectric system of the on-chip can be changed using the different hole or lattice size made into the dielectric system (in the case of photonics crystal or photonics bandgap materials) along the signal line(s). Alternatively, if the trenches are used, the loss-tangent (and also dielectric constant) can be changed using the different size and shape of the trenches (as shown in FIGS. 3 and 8) along the signal line(s). Alternatively, if the comb-shaped dielectric system as shown in FIGS. 9 to 13 is used, the dielectric constant along the signal lines by using the different sizes and/or shapes of the comb-shaped dielectric system (not shown).

Off-Chip Interconnections Process:

In the preferred embodiment as explained below, it is an object to use the techniques as explained in FIGS. 3 to 15, in the off-chip interconnects for two or multiple chips interconnection on the board. The board here considered is the board made from FR4 or other polymer materials. Similar technique can be applicable for other dielectric material based board as explained earlier.

Figure 16:
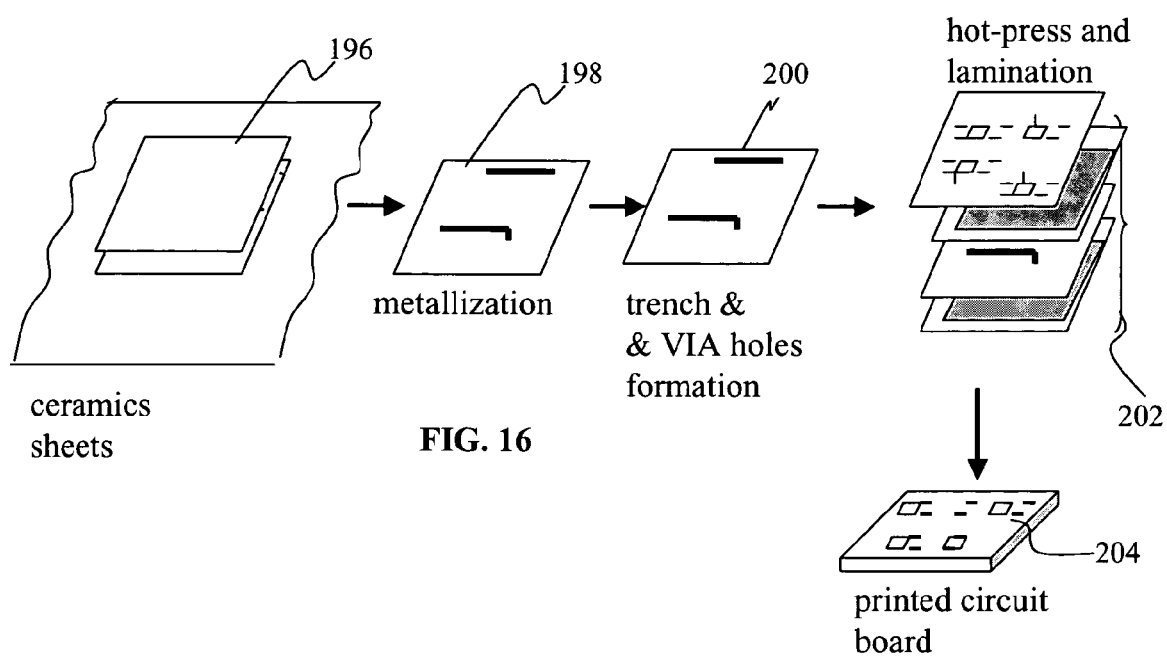
FIG. 16 is a schematic illustrating the fabrication process of the multilayered PCB having the opened trenches under the signal lines in the fourteenth preferred embodiment in accordance to the present invention.

FIG. 16 is the schematics illustrating the fabrication process of the multilayered PCB having the opened trenches under the signal lines in the fourteenth preferred embodiment in accordance with the present invention, where in the like parts are indicated by the like numerals, so that repeated explanation is omitted here. The dielectric sheet (not shown) is made using the standard PCB technology for example using the slurry casting process. The slurry is cast into about 200 µm to 500 µm thick ceramic sheets by slip cast process.

The preorder dielectric sheets of 196 are made. As metallization process 198, low resistivity conductor paste onto the punch sheet. In this process, via holes are filled with the paste to form the contacts between the signal lines. Low electrical resistivity material such as silver-palladium, and gold instead of molybdenum or tungsten refractory material can be used. The sheets are sintered at high temperature, which makes lower electrical resistivity. Metallization sheet 198 is made using the conventional PCB technology. After the metallization process 198, opening trench process 200 is done for the specific dielectric sheets, which carry the high-speed signal line. The trenches are opened under the signal line, which can be any type of microstrip line, or strip line or coplanar line as explained previously. The trenches can be made using the processes such as laser drilling, or dry-etching or wet-etching (following patterning for etching) or mechanical drilling process. The sheets after trenches process 200 are precisely stacked in a pressing die in sequence by the stacking machine. These sheets 202 are laminated together by hot press. Density heterogeneities in the laminated samples influence any shrinkage in the sintered substrate. Therefore, this lamination process is homogenously carried out by means of the correct dimensional die and punch with flat surfaces. Burn out and sintering process for the multilayered PCB board 204, may necessary after lamination at the temperature suitable to ceramic material used as the sheet.

If used array of air holes for reducing the effective dielectric constant and effective loss tangent, the process (not shown) is little different than that of explained in FIGS. 16. Array of air holes are made into the ceramic (dielectric) substrate to make the preorder dielectric structure as explained previously, and these are done before going to the metallization process 198. Air holes can be made using the processes such as laser drilling, or dry etching or wet etching (following patterning for etching). Via holes are formed through the dielectric sheet with air holes by a punching machine with punches and dies. A ceramic sheet may have more than 10,000 via holes in a 250 µm-square area. As the dielectric system have air holes, additional process may necessary to fill the air holes and filling the via holes which followed by wet etching of the to take filler out. In the case of air-holes ceramic, the process 200 of trench and VIA holes formation only has the via formation. If trenches are needed, trenches can be opened in the process 200.

FIG. 17 is a schematic illustrating the stacking of multiple dielectric layers for microstrip type and strip line type signal lines for the PCB having the opened trenches under the signal lines in the fifteenth preferred embodiment in accordance to the present invention, wherein the same numerals represent the same parts as shown earlier, so that similar explanations are omitted here. In the preferred embodiment, the layers are maded for stacking for high speed signal lines of microstrip and stripline type transmission lines. Single or multiple high-speed signal lines can be laid on the single dielectric layer. For simplicity, single signal line sandwiched by different dielectric layers for having the ground plan, is shown. In accordance to this invention, similarly, single or multiple signal lines in different layers, sandwiched by dielectric layers are also possible.

According to this invention, the opened-trenches can be made either in the same dielectric having the signal line or in the dielectric having the ground lines (not shown).

Figure 18:
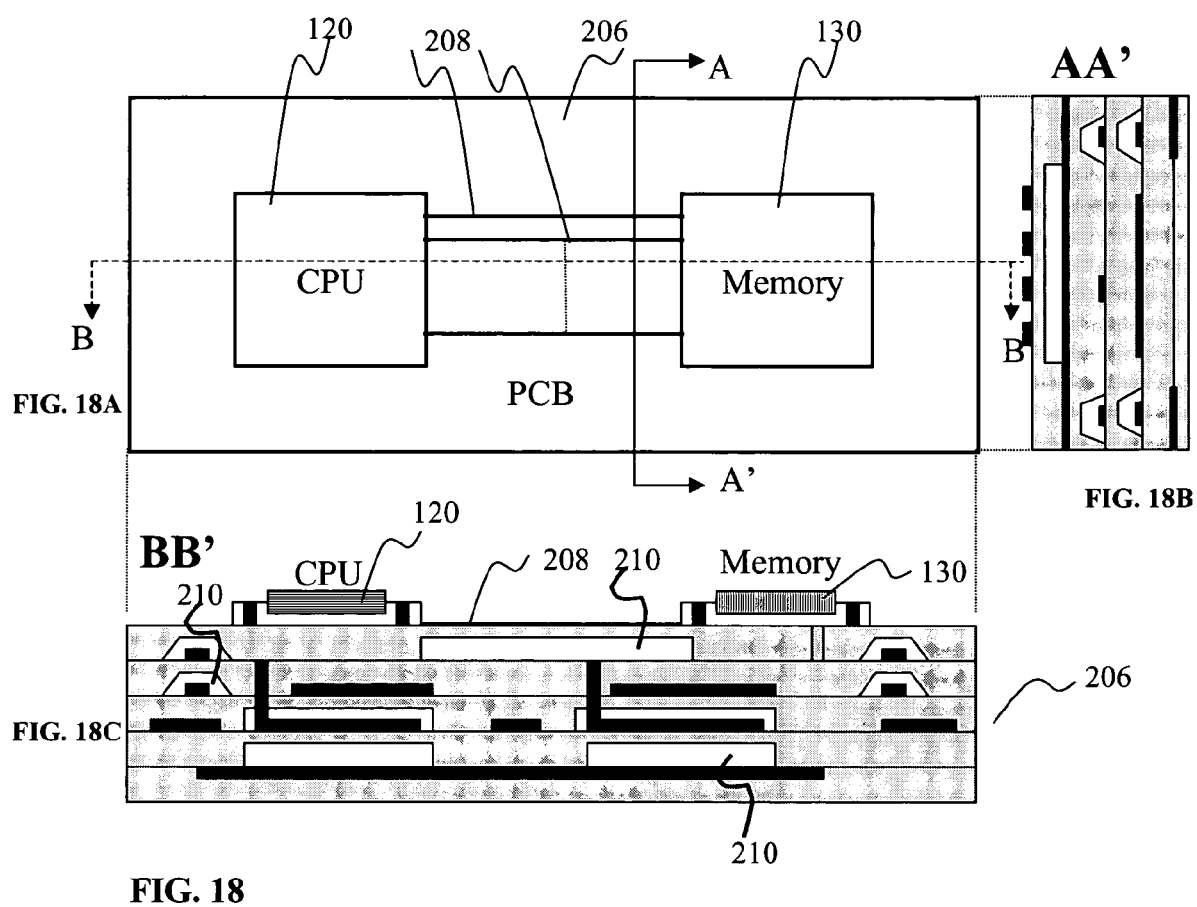
FIG. 18A is the top view and 18B and 18C are the enlarged side and front cross-sectional views along AA' and BB' direction of FIG. 18A, illustrating the interchip (off-chip) interconnections consisting of the multilayered PCB in the sixteenth preferred embodiment according to the present invention.

FIG. 18A is the top view and FIGS. 18B and 18C are cross-sectional views along AA' and BB' directions of FIG. 18A in the sixteenth preferred embodiment wherein the like parts are indicated by the like numerals as used earlier, so that similar explanations are omitted here. In the preferred embodiment, two chips interconnection are shown. As an example, processor 120 and memory 130 interconnection are shown as part 206 of PCB using the techniques explained earlier. The high speed signal line 208 can be taken from the top of the PCB layer and lower speed signal line can be take brought to the lower layer. This would reduce the possibility any discontinuities, which may arise due to the vias. Bandwidth of the interconnects using of the technique as mentioned previously, can be attained and there by on-chip's signal speed can be preserved. According to the preferred embodiment as shown in FIG. 18, layer with high-speed signal comprises with the opening trenches 210 under the signal line or both side of the signal lines. For the case of the air-holes type of dielectric layers (not shown here), either whole portion of the PCB comprise with the periodic dielectric structure or the portion where the high speed chips needed to be connected, can have the periodic dielectric structure and the rest where low speed chips are needed to be connected, are having the uniform dielectric structure in the PCB. For simplicity in drawing, enlarge portion of cross-sectional views for high speed (e.g. processor and memory) chips portion interconnects are only shown. Complete PCB portion with considering lower speed chip interconnects are not shown.

Figure 19:
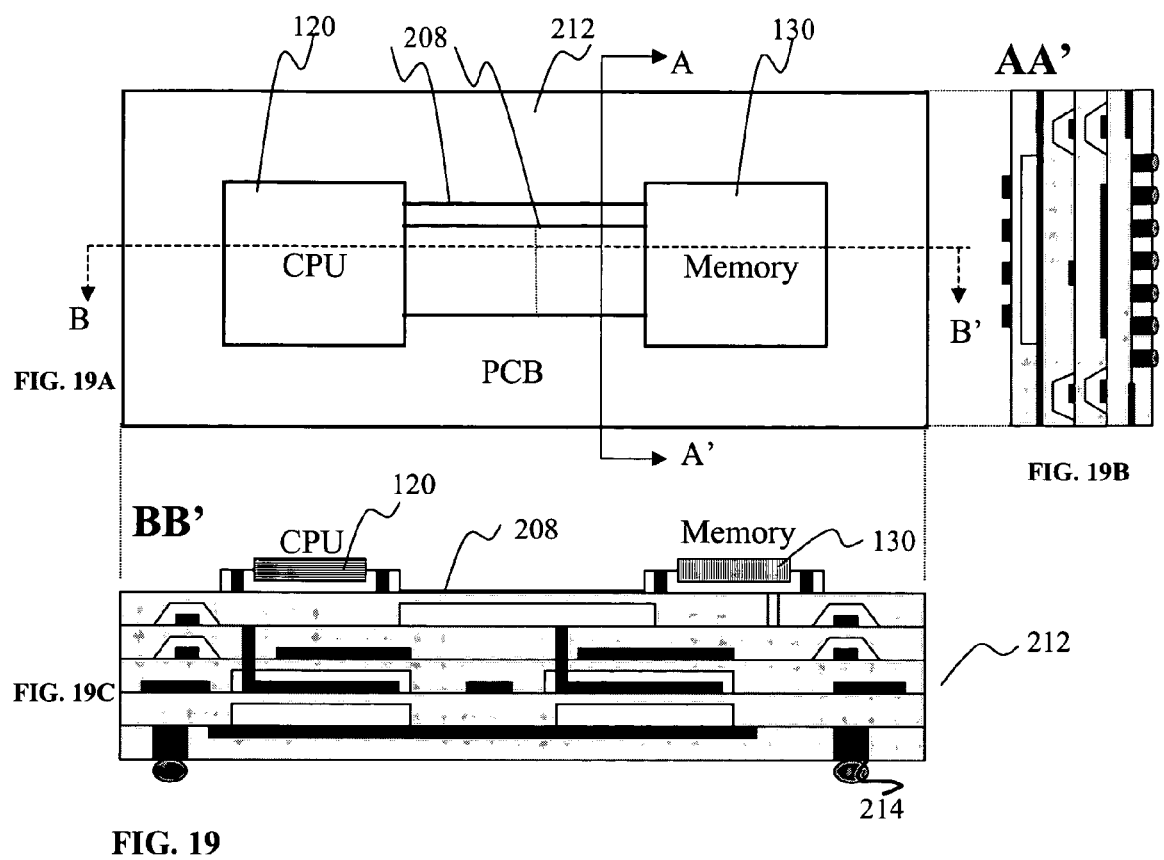
FIGS. 19A is the top-view and 19B and 19C are the enlarged side and front cross-sectional views along AA' and BB' directions of FIG. 19A, illustrating mountable/stackable the interchip (off-chip) interconnections consisting of the multilayered PCB in the seventeenth preferred embodiment according to the present invention.

FIG. 19A is the top view and FIGS. 19B and 19C are enlarged cross-sectional views along AA' and BB' directions of FIG. 19A in the seventeenth preferred embodiment wherein the like parts are indicated by the like numerals as used earlier, so that similar explanations are omitted here. In the preferred embodiment, two chips interconnection are shown as a part of separate multi-chip-module (MCM) board. In the preferred embodiments, alternatively, the high-speed chips interconnect in the separate board 212 comprising dielectrics layers, some of which have the trenches carrying the signal lines and ground planes. For example, for connecting the processor and memory, board with trenches or periodic dielectric structure (not shown), and metal conductors can be used and they can be fabricated using the process as explained in FIG. 18. Each board has the pins 214 coming out from the outside of the PCB board 212 which can be mountable on to the conventional PCB board for ground/power and low speed connections.

According to preferred embodiment, off-chip interconnects using the dielectric system can have single or multiple techniques (for reducing the microwave loss), as explained in FIGS. 3 thru 15, open trenches or air (or gas or vacuum) hole arrays can be used in the dielectric system. Alternatively the low dielectric constant material or the liquid crystal polymer fills up the trenches or holes.

According to this invention, the different features for example, emphasize/equalization features can also be designed passively on the PCB board by controlling the dielectric constant of the board along the signal lines utilizing the dielectric systems comprising the single or multiple combination of the dielectrics as shown in FIGS. 3 to 15. The dielectric constant (and also the loss tangent) along the signal lines located in the dielectric system of the PCB can be changed using the different hole or lattice size made into the dielectric system (in the case of photonics crystal or photonics bandgap materials) along the signal line(s). Alternatively, if the trenches are used, the loss-tangent can be changed using the different size and shape of the trenches along the signal line(s). Alternatively, if the comb-shaped dielectric system as shown in FIGS. 9 to 13 is used, the dielectric constant along the signal lines by using the different sizes and/or shapes of the comb-shaped dielectric system.

According to this invention, the high-speed off-chip interconnects for both electrical and optical signal transmission can also be possible into the same PCB board without using additional layer. As the dielectric system comprises with the trenches or air holes or comb-shaped dielectric as shown in FIGS. 3 to 15, are used, the same dielectric system can be used for both transmitting the electrical and optical signals.

In the preferred embodiment, portions of the signal line (strip lines configuration) structure are shown for explanation purpose. This structure is for the reducing the effective dielectric constant and effective loss tangent of the dielectric system, which results in increasing the signal carrying capacity of the interconnects and also reduce the signal propagation delay between the channels, help to eliminate the skews between the channels. This structure help to eliminate the using of the pre-emphasize/equalization circuit and more simplify the board design in the case of the off-chip interconnects.

In the preferred embodiments, the dielectric substrate is mentioned in an object to cover all dielectric materials, which show the dielectric properties. The dielectric materials include all kinds of ceramic materials such as Duroid, FR4, AlN, $Al_2O_3$, Mullite ($3Al_2O_3$: $2SiO_2$), SiC, $SiO_2$, Silicon nitride, Silicon-Oxy-Nitride, BeO, Cordie-rite (magnesium alumina silicate), BN, Glass (with different compositions), epoxy glass, CaO, MnO, $ZrO_2$, PbO, alkali-halide (e.g. NaBr, NaCl) etc.) etc., and all kinds of the polyimides and benzocyclobutenes (BCBs) having dielectric properties. Polymer dielectric material also includes, but not limited to, Teflon, liquid crystal polymer, epoxy, parylene, silicone-polyimide, silicone-gel, and fluorinated ethylene propylene copolymer. It also includes materials of elastomers (e.g. silicone elastomer), monomers, and gels. All standard polymers can be available from the standard manufacturer for example, Du-pont, Hitachi-Chemical, Mitsui, and Mitsubishi-Chemical Industries. Liquid crystal polymer is marketed by Gore-Tex, Japan.

In the preferred embodiments as explained in FIGS. 3 to 19, dielectric systems consisting of trenches or air (vacuum or gas) holes spheres or cylinders arrays or comb-shaped with teeth into the dielectric substrate are considered. The holes, trenches or the space between the teeth in comb-shaped dielectric as shown in FIGS. 3 to 19, can be filled with air or any dielectric materials having lower dielectric constant than the dielectric substrate. Alternatively, in the preferred embodiment, holes, trenches or the space between the teeth in comb-shaped dielectric can be filled up fully by the liquid crystal material or coated by liquid crystal. The electrical field can change the orientation of the liquid crystal and can have the controllability of the effective dielectric constant and effective loss tangent of the dielectric system. The trenches shape could be the square, rectangular, circular or the shape convenient to manufacturing process.

According to the present invention, the technique of reducing the microwave-loss induced due to the dielectrics by reducing the effective loss-tangent of the dielectric system, are explained in the preferred embodiments as shown in FIGS. 3 to 19. The effective dielectric constant would also be reduced for the dielectric system of the interconnects explained as preferred embodiments, which help to reduce the signal propagation delay.

The preferred embodiments can be applied in many applications in different ways and forms. For examples, preferred embodiments mainly can be used for high speed interconnects for connecting high-speed multiple (two or more) electronics elements. The application includes, but not limited to, (a) on-chip interconnects for example, for connecting the electronics devices and/or connection electrical and optical devices, (b) off-chip interconnects for example, connecting two or more electronics chips on the board, (c) high speed chip (die) packaging, (d) high speed electrical cable for connecting multiple electrical modules for example board-to-board interconnection, rack-to-rack interconnection, etc. and (e) high speed connector, used as interface means to connect high speed electronics elements. Different features such as the pre-emphasize or equalizer can also be possible passive way utilizing the dielectric constant changes over the surface.

In the preferred embodiments as explained above, different applications are explained in an object of showing the application (of the techniques to reduce the microwave loss and increasing the bandwidth), but not limited to, the specific description provided.

In the preferred embodiments as explained in FIG. 8 to 13 and FIGS. 16 to 19, only single microstrip type or strip line configurations are considered. However, in accordance with the present invention, other signal lines, not mentioned here, such as coplanar line configuration with single or multiple signal lines (as single or differential-ended) also include. Dielectric coverage (not shown) using of the same or different dielectric material can be used. Dielectric structure consisting of trenches or multilayered of dielectric periodic structure, as shown in FIGS. 3 to 15, can also be used in the PCB for high-speed off-chip interconnects.

According to this invention, high speed packaging for electrical or opto-electronics integrated circuit (IC) (die package), can also be designed based on the techniques as explained in FIGS. 3 thru 19. For reducing the microwave loss, dielectric system comprising with the single or multiple combination of the dielectrics as explained in FIGS. 3-19, and the appropriate metal electrodes for signal, ground, and power lines/pads can be used, which reduces the effective dielectric constant and loss tangent, and help to increase the signal carrying capacity of the package (not shown).

According to the invention, the high speed electrical IC and optical IC packaging can also be integrated into single package. As the trenches or air holes or comb-shaped dielectric system as shown in FIGS. 3 to 19, are used, the packaging which also carries the electrical and optical signals, can also be made to route into the same dielectric system, made from the trenches, air-holes, or comb-shaped dielectric.

According to this invention, high speed connectors and cables for multi-gigahertz signal interface and media, respectively, can be designed based on the techniques as explained in FIGS. 3-19. Reducing the microwave loss implementing the trenches or periodic dielectric structure or the comb-shaped dielectric structure as explained previously can able to increase the bandwidth of the connector and also cables (not shown). Single-ended or differential pairs connectors (and also cables can be designed based on the techniques as explained previously. According to this invention, single or multiple channel connectors can also be designed.

According to this invention, the high-speed cables (or connectors) for both electrical and optical signal transmission can also be integrated into single cables. As the dielectric system comprises with the trenches or air holes or comb-shaped dielectric as shown in FIGS. 3-19, are used, the same dielectric system can be used for both transmitting the electrical and optical signals.

According to this invention, the high speed cable having zero equalization and/or zero dispersion/attenuation and also having single or multiple channels, can also be made using the dielectric system comprising single or multiple combination of the dielectrics as shown in FIGS. 3-19, wherein the dielectric constant and loss tangent are varied along the length of the cables. The frequency response of the cables can be adjusted passively by adjusting the dielectric constant along the length of the cables. For example, the low frequency components can be made to lossy and the high frequency component can be made to less lossy, which can make the total frequency response flat.

The present invention has been described above by way of its embodiments. However, those skilled in the art can reach various changes and modifications within the scope of the idea of the present invention. Therefore it is to be understood that those changes and modifications also belong to the range of this invention. For example, the present invention can be variously changed without departing from the gist of the invention, as indicated below.

According to the present invention, it is the object to provide the interconnects technique by which the microwave loss can be reduce and increase the bandwidth of the interconnects. It is also the object to use any dielectric material (including conventional dielectric material and the manufacturing technology) in the technique and could increase the bandwidth tremendously. In simplicity of drawing, preferred embodiments are described mostly considering the microstrip line configuration. However, all transmission lines configurations such as strip line, coplanar line with single or multiple signal lines (including differential line) also cover this invention.

Several preferred embodiments for high-speed on-chip and off-chips interconnects are described considering the microstrip line configuration with opened trenches or the dielectric periodic structure consisting of the cylindrical (spherical) air holes arrays or comb-shaped dielectric. All transmission lines configurations as mentioned earlier cover under this invention. In the case of the trenches, all kinds of shapes such as the square, circular, or rectangular or any shape convenient to the manufacturing. In the case of the air-holes periodic structure, the shape of each cell could be any type such as square, or any polynomial shape, and those can be filled up by dielectric material having the lower dielectric constant than the dielectric substrate.

In the preferred embodiments as explained in FIGS. 3 to 19, in simplicity of drawings mostly surrounding of the high speed single lines are considered with having trenches opened, or air-holes periodic structure or comb-shaped dielectric structure. In on-chip or off-chip interconnects, either of configurations or mixes of configuration can also be used in the multi-layered interconnects.

In the preferred embodiments as explained in FIG. 8, for simplicity in drawing, a dielectric system comprises with the dielectric periodic structure based on the 2-D photonic (or electronics or electromagnetic) crystal is shown. The dielectric system could be based on fully photonic crystal where photonic band-gap effect can use or quasi-photonic crystal. This also includes 3D photonic (electronics or electromagnetic crystal).

In the preferred embodiments, as explained in FIGS. 3-19, the rigid type high-speed interconnects for PCB applications are considered. This invention also covers high-speed flex type interconnects for flex printed circuits applications.

In the preferred embodiments, as the open-trenches or air holes or comb-shaped dielectric structure is used, the combination of optics and electronics interconnects are also feasible. Especially, the optics can pass through the trenches (air filled) or opening portion of the interconnects whose speed over 40 Gb/s or beyond, and the electrical signal over 5 Gb/s to 40 Gb/s can pass through the metal signal line-configuration disclose in this invention. Additional transmission media may not be necessary to build for having optical and electrical signal purpose.

The advantages of this invention is that the trench of the proposed interconnects can also be used for cooling the interconnects/board. The trench can be filled with the coolant or gas to dissipate the heat generated due to electrical signal flowing through the electrical signal lines or heat generated due to the other active (e.g. chip) and passive (resistor) component's power consumption. Similar technique also be used to cool the on-chip and cable cooling. Using this structure both cooling the board and also high speed performance can be achieved.

According to this invention, the interconnects with opened-trench can be used to transmit the optical signal through the air or vacuum or low loss-tangent material, filled the trench. In that case, ultra high speed interconnects comprising with electrical and optical signals can be achieved. As the same trench can be used for both electrical and optical interconnects, high density can be achieved for high-speed transmission.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

The present invention is expected to be found practically use in the high-speed on-chip, off-chip interconnects, where the signal speed 5 Gb/s to beyond (as high as 200 Gb/s) are necessary using of the conventional material, and the bandwidth of the interconnects can be made to ideally to speed of the light for no-loss transmission line. The present invention can also be implemented in the high-speed single or multiple signal connectors, and high-speed cables (not shown). The applications include on-chip interconnects where high-speed electronics chips or electronics chips with optical chips are need to be connected. As ideally the bandwidth of the interconnect system can be made to close to fiber, future monolithic (and also hybrid near future) integration of electronics and optical chips can also interconnected without (much or none at all) sacrificing the chips speed. The application also includes the high speed multi-chip module interconnection, 3-D chip or memory interconnection, high speed parallel system for computer animation and graphics for high speed 2-D or 3-D video transmission, and high bandwidth image display, high speed router where high speed electronics switches (or IC) are needed to be interconnected. The application also include the high speed (5 GHz and beyond) connectors and cables for high speed board-to-board, rack-to-rack interconnection, and also single or multiple high-density signal connections and carrying from one side to other in longer path.

What is claimed is:

1. A high-speed electronics interconnection system comprising:
    a first ground plane which is either continuous or discontinuous;
    a first dielectric layer having at least one first open trench on one side of said dielectric layer wherein said first ground plane is not encased by said at least one open trench;
    a second dielectric layer having at least one second open trench, wherein said second dielectric layer is located in close proximity to said first dielectric layer;
    at least one electrical signal line located on said second dielectric layer;
    a second ground plane which is either continuous or discontinuous; and
    a third dielectric layer;
wherein said at least one electrical signal line, said first and second dielectric layers, and said first and second ground planes are stacked together to form a transmission line, wherein said first and second open trenches in said first dielectric layer and said second dielectric layer are located under and above, respectively, said at least one electrical signal line to reduce the microwave loss induced due to said first and second dielectric layers in order to increase the bandwidth of the interconnection system, wherein said at least one-electrical signal line is sandwiched by said first and second ground planes, said first and second open trenches, and the portion of dielectrics remaining in said first and second dielectric layers.

2. The system according to claim 1 wherein said at least one electrical signal line has a microstrip line configuration, wherein said at least one electrical signal line is laid on said second dielectric layer and is exposed to air or any dielectric media, and said second ground plane is located on the opposite sides of said second dielectric layer which contains said at least one electrical signal line.

3. The system according to claim 1 wherein said at least one electrical signal line has a coplanar line configuration, wherein said at least one electrical signal line and said first and second ground planes are in the same plane, side by side and laid on said second dielectric layer, and are exposed to the dielectric media or in air media.

4. The system according to claim 1 wherein said at least one electrical signal line is of stripline type, microstrip line type, or coplanar type and is designed with said first and second open trenches in said first and second dielectric layers, respectively, wherein interconnect performance and characteristics are controlled by selecting physical parameters and by said first and second open trenches created in said first and second dielectric layers.

5. The system according to claim 1 wherein said first and second open trenches in said first and second dielectric layer can be used for said at least one electrical signal line located in close proximity to each other.

6. The system according to claim 1 wherein the shape of said first and second open trenches can be quadrilateral, circular, square, rectangular, or any other shape convenient for manufacturing.

7. The system according to claim 1 wherein a second said at least one electrical signal line, with said first and second open trenches underneath, is located in the same or a different plane than said at least one electrical signal line, which can be aligned parallel with, perpendicular to, or at any angle suitable for design and manufacturing to said at least one electrical signal line.

8. The system according to claim 1 wherein said first and second open trench either touches or does not touch said at least one electrical signal line and/or said first or second ground plane, as required to achieve the interconnect bandwidth.

9. The system according to claim 1 wherein said first dielectric layer and/or said second dielectric layers can have a full or partial Photonics crystal or electronic crystal structure, comprising:
    periodic arrays structured as dielectric spheres or cylinders with certain diameters and certain spans, wherein said dielectric spheres or cylinders are contained in said first dielectric layer and/or said second dielectric layer.

10. The system according to claim 1 wherein said first and/or second open trenches are filled with low-loss dielectric material, liquid crystal dielectric material, gas, or a vacuum.

11. The system according to claim 1 wherein the size and shape of said first and/or second open trenches can be changed along said at least one electrical signal line to control the dielectric constant and the loss-tangent of said at least one electrical signal line to achieve different passive-functionality.

12. The system according to claim 1, used for interconnection of electrical elements and/or optical elements, wherein said first and second dielectric layers with said first and/or second open trenches can be used for both electrical and optical signal transmission so that at least one electrical signal can flow through said at least one electrical signal line and/or at least one optical signal can pass through said first and/or second open trenches.

13. The system according to claim 1 wherein said first and/or second open trenches made inside said dielectric layers are filled with a coolant for cooling the interconnection system.

14. The system according to claim 1 wherein either said first ground plane or said second ground plane is located on the same layer as said at least one electrical signal line(s) to form a stacked coplanar transmission line.

15. The system according to claim 1 wherein said first ground plane and/or said second ground plane is discontinuous.

16. The system according to claim 1 wherein said first ground plane covers the sidewalls of said at least one open trench of said first dielectric layer and/or said second ground plane covers the sidewalls of said at least one open trench of said second dielectric layer.

17. A high-speed electronics interconnection system comprising:
   a first dielectric substrate of uniform thickness;
   a first ground plane;
   a first comb-shaped dielectric system comprising:
      a series of dielectric teeth, with certain thickness and a certain separation distance between said teeth forming open trenches between said teeth, located on one side of a dielectric layer of uniform thickness which forms the long, solid part of said first comb-shaped dielectric system;
   a second comb-shaped dielectric system comprising:
      a series of dielectric teeth, with certain thickness and a certain separation between said teeth forming open trenches between said teeth, located on one side of a dielectric layer of uniform thickness which forms the long, solid part of said second comb-shaped dielectric system;
   at least one electrical signal line located between said teeth of either said first comb-shaped dielectric system or said second comb-shaped dielectric system, on the said long, solid dielectric layer, either on the side opposite of said teeth or on the same side as said teeth; and
   a second ground plane parallel to said first ground plane;
wherein said first uniform dielectric substrate, said first comb-shaped dielectric system, said second comb-shaped dielectric system, said ground planes, and said at least one electrical signal line are stacked to make a transmission line configuration, wherein said open trenches between said teeth of said first comb-shaped dielectric system help to reduce the effective loss-tangent, thereby increasing the interconnect bandwidth.

18. The system according to claim 17 wherein said at least one electrical signal line and/or said first and/or second ground plane are located on said first or second comb-shaped dielectric system or said uniform dielectric substrate, and said dielectric systems are stacked to make a transmission line configuration of stripline, microstrip line, or coplanar type, wherein said open trenches of said comb-shaped dielectric systems are aligned either perpendicular or parallel to said at least one electrical signal line.

19. The system according to claim 17 wherein the shapes of said open trenches between the teeth of said comb-shaped dielectric systems are quadrilateral, square, rectangular, circular, or any shape convenient for manufacturing.

20. The system according to claim 17 wherein the size and shape of said open trenches between said teeth of said comb-shaped dielectric systems can be selected based on the requirement of the effective tangent-loss or effective dielectric-constant for said interconnection system.

21. The system according to claim 17 wherein said open trenches can be filled with air, gas, a vacuum, low-loss tangent material, or liquid crystal polymer materials.

22. A high-speed electrical interconnection system connecting at least two active or passive electrical elements, comprising:
   at least one electrical signal line;
   a comb-shaped dielectric system including:
      a series of dielectric teeth having a certain thickness and a certain separation between said teeth forming open trenches between said teeth, and;
      a first uniform dielectric layer, wherein said series of dielectric teeth are attached to said first uniform dielectric layer, and said at least one electrical signal line is located on said first uniform dielectric layer, wherein the shape of said separation between said teeth is quadrilateral, square, rectangular, circular, or any shape convenient for manufacturing, and said separation is filled with air, a vacuum, low-dielectric constant material, or low-loss tangent material;
   a ground line; and
   a second uniform dielectric layer;
wherein said comb-shaped dielectric system, said uniform dielectric layers, said ground line, and said at least one electrical signal line are stacked to form a transmission line configuration, maintaining the specific characteristic impedance, wherein said open trenches between said teeth under said at least one electrical signal line help to reduce the loss-tangent for thus increasing the interconnect bandwidth.

23. The system according to claim 22 wherein said open trenches between said teeth of said comb-shaped dielectric system, are aligned parallel, perpendicular, or at any angle to said at least one electrical signal line.

24. The system according to claim 22 wherein said interconnection system is implemented in a high-speed cable, having single or multiple channels.

25. The system according to claim 22 wherein a high-speed cable having single or multiple channels is made having said open trenches filled with air or made a vacuum, made inside the dielectric system along said at least one electrical signal line.

26. The system according to claim 22, wherein said open trenches between said teeth are made using standard manufacturing techniques such as mechanical drilling, laser drilling, or wet/dry etching.

27. The system according to claim 22, wherein the size and shape of said open trenches of the said first and second dielectric systems are the same or different.

28. A high-speed electronics interconnection system comprising:
   at least one electrical signal line;
   at least one discontinuous ground plane on a separate surface than said at least one electrical signal line, with all other ground planes are on the same surface as said at least one electrical signal line
   a dielectric system separating said at least one discontinuous ground plane and said at least one electrical signal line and isolating electronic elements, wherein said dielectric system comprises;

at least one layer of dielectric material having at least one backside slot or trench, wherein said at least one backside slot or trench is located under said at least one electrical signal line and formed in said dielectric material to reduce the microwave loss and increase the interconnect bandwidth, wherein said discontinuous ground plane does or does not line the side walls of said backside slot or trench.

29. The system according to claim 28 wherein said at least one discontinuous ground plane is continuous and lines the walls of said at least one backside slot or trench.

30. A high-speed electronics interconnection system comprising:

a dielectric system having a first and second surface;

at least one electrical signal line located on said first surface;

at least two non-signal conductive lines on said first surface in close proximity to said at least one electrical signal line, and;

no non-signal conductive plane on said second surface;

wherein said dielectric system comprises;

at least one layer of dielectric material having at least one backside slot or trench of a certain shape, wherein said at least one backside slot or trench is located under said at least one electrical signal line and formed in said dielectric material to reduce microwave loss.

31. A high-speed electronics interconnection system comprising:

at least one electrical signal line;

at least one ground plane on a separate surface than said at least one electrical signal line, with the remainder of ground planes on the same surface as said at least one electrical signal line;

a dielectric system separating said ground or power plane and said at least one electrical signal line and isolating electronic elements, wherein said dielectric system comprises:

at least one layer of dielectric material having at least two backside slots or trenches for each said at least one electrical signal line, wherein said at least two backside slots or trenches are located under said at least one electrical signal line and formed in said dielectric material to reduce the microwave loss and increase the interconnect bandwidth, wherein said ground or power plane is either continuous or discontinuous.

* * * * *